US 12,089,380 B2

(12) United States Patent
Nishimachi

(10) Patent No.: US 12,089,380 B2
(45) Date of Patent: Sep. 10, 2024

(54) POWER CONVERSION DEVICE

(71) Applicant: DENSO CORPORATION, Kariya (JP)

(72) Inventor: Seiichiro Nishimachi, Kariya (JP)

(73) Assignee: DENSO CORPORATION, Kariya (JP)

( * ) Notice: Subject to any disclaimer, the term of this patent is extended or adjusted under 35 U.S.C. 154(b) by 200 days.

(21) Appl. No.: 17/833,195

(22) Filed: Jun. 6, 2022

(65) Prior Publication Data

US 2022/0304185 A1    Sep. 22, 2022

Related U.S. Application Data

(63) Continuation of application No. PCT/JP2020/044189, filed on Nov. 27, 2020.

(30) Foreign Application Priority Data

Jan. 22, 2020    (JP) ................. 2020-008622

(51) Int. Cl.
*H05K 7/20*        (2006.01)
*H02M 7/00*        (2006.01)
*H02M 7/5387*      (2007.01)

(52) U.S. Cl.
CPC ............ *H05K 7/209* (2013.01); *H02M 7/003* (2013.01); *H02M 7/5387* (2013.01)

(58) Field of Classification Search
CPC ..... H05K 7/209; H02M 7/003; H02M 7/5387
USPC ....................................................... 351/704
See application file for complete search history.

(56) References Cited

U.S. PATENT DOCUMENTS

| | | | | |
|---|---|---|---|---|
| 4,392,153 A | * | 7/1983 | Glascock, II | H01L 23/051 257/E23.098 |
| 6,542,365 B2 | * | 4/2003 | Inoue | H01L 23/473 361/689 |
| 6,956,742 B2 | * | 10/2005 | Pfeifer | H02M 7/003 257/E23.098 |
| 7,200,007 B2 | * | 4/2007 | Yasui | H02M 7/003 338/53 |
| 8,634,194 B2 | * | 1/2014 | Yamaura | H05K 7/20927 361/709 |
| 8,717,760 B2 | * | 5/2014 | Iguchi | H05K 7/20927 361/689 |

(Continued)

FOREIGN PATENT DOCUMENTS

| | | |
|---|---|---|
| JP | 2016-158358 A | 9/2016 |
| JP | 2020-010560 A | 1/2020 |

*Primary Examiner* — Anatoly Vortman
(74) *Attorney, Agent, or Firm* — Oliff PLC

(57) ABSTRACT

A power conversion device includes a semiconductor module group including a plurality of semiconductor modules having a semiconductor element and a main terminal, a dummy module, a cooler having a plurality of heat exchange portions, a capacitor module, and a bus bar. The semiconductor module and the dummy module are arranged side by side, and the heat exchange portions are arranged so as to sandwich each of the semiconductor module and the dummy module from both sides so as to form a laminated body. The bus bar electrically connects the capacitor module and the main terminal. The dummy module has a metal body and a dummy terminal which continues from the metal body and connects to the bus bar. The metal body forms at least a part of the surface of the dummy module sandwiched by the heat exchange portion.

8 Claims, 10 Drawing Sheets

(56) References Cited

U.S. PATENT DOCUMENTS

| | | | | |
|---|---|---|---|---|
| 8,792,244 B2* | 7/2014 | Funatsu | ............. | H05K 7/20927 |
| | | | | 361/677 |
| 9,241,413 B2* | 1/2016 | Guerin | ...................... | H01G 9/26 |
| 9,713,293 B2* | 7/2017 | Takeuchi | ................. | H01G 4/40 |
| 10,854,589 B2* | 12/2020 | Sugita | ............... | H01L 23/49575 |
| 11,056,417 B2* | 7/2021 | Yamaura | ............... | H02M 7/003 |
| 11,538,794 B2* | 12/2022 | Matsuoka | ............... | H01L 25/07 |
| 2003/0090873 A1* | 5/2003 | Ohkouchi | ............. | H01L 25/072 |
| | | | | 257/E23.098 |
| 2004/0144996 A1* | 7/2004 | Inoue | .................... | H01L 25/072 |
| | | | | 257/E23.098 |
| 2005/0040515 A1* | 2/2005 | Inoue | .................... | H01L 23/473 |
| | | | | 257/E23.098 |
| 2005/0259402 A1 | 11/2005 | Yasui et al. | | |
| 2006/0120047 A1* | 6/2006 | Inoue | ...................... | H01L 24/33 |
| | | | | 257/E23.098 |
| 2006/0232939 A1* | 10/2006 | Inoue | ...................... | H01L 24/33 |
| | | | | 361/720 |
| 2014/0119087 A1* | 5/2014 | Matsuoka | ............. | H02M 7/003 |
| | | | | 363/132 |
| 2019/0333909 A1* | 10/2019 | Sugita | ................... | H01L 25/112 |
| 2020/0020609 A1* | 1/2020 | Yamaura | ............... | H01L 23/473 |
| 2020/0321319 A1* | 10/2020 | Matsuoka | ........... | H01L 29/7393 |
| 2021/0144888 A1* | 5/2021 | Sano | ...................... | H02P 27/06 |
| 2023/0021288 A1* | 1/2023 | Nishimachi | ........... | H02M 1/327 |

* cited by examiner

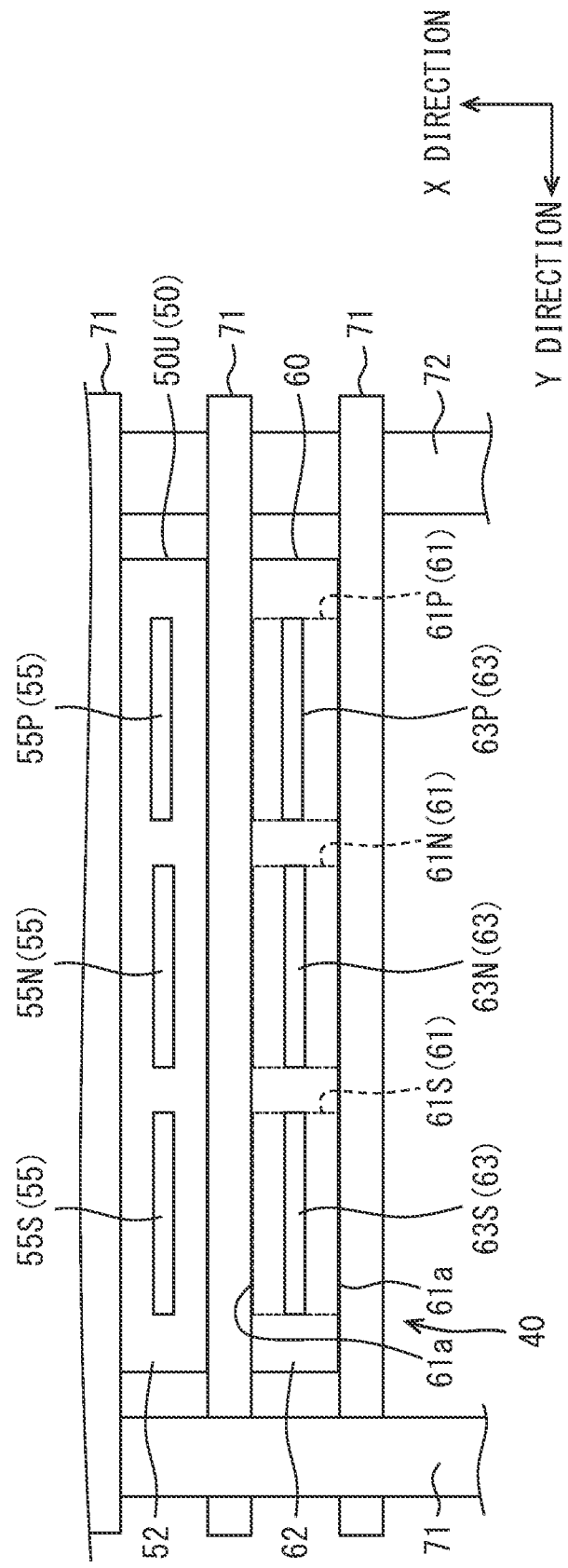

US 12,089,380 B2

POWER CONVERSION DEVICE

CROSS REFERENCE TO RELATED APPLICATIONS

The present application is a continuation application of International Patent Application No. PCT/JP2020/044189 filed on Nov. 27, 2020, which designated the U.S. and claims the benefit of priority from Japanese Patent Application No. 2020-8622 filed in Japan filed on Jan. 22, 2020, the entire disclosure of the above application is incorporated herein by reference.

TECHNICAL FIELD

The present disclosure relates to a power conversion device.

BACKGROUND

The power conversion device includes a semiconductor module, a dummy module, and a cooler unit including a plurality of heat exchange portions having a flow path through which a refrigerant flows.

SUMMARY

One object disclosed is to provide a power conversion device with a long capacitor life.

The power conversion device disclosed herein includes
a semiconductor module group including a plurality of semiconductor modules having at least one semiconductor element constituting a power conversion circuit and at least one main terminal electrically connected to the semiconductor element, at least one dummy module that does not have a semiconductor element and is arranged side by side with at least some semiconductor modules, a cooler unit including a plurality of heat exchange portion having a flow path through which the refrigerant flows respectively and being configured to arrange so as to sandwich each of the semiconductor module and the dummy module from both sides in an arrangement direction of the semiconductor module and the dummy module, a capacitor, and at least one bus bar that electrically connects the capacitor and the main terminal.

BRIEF DESCRIPTION OF DRAWINGS

FIG. 14 is a planar view illustrating a modification.

DETAILED DESCRIPTION

Figure 1:
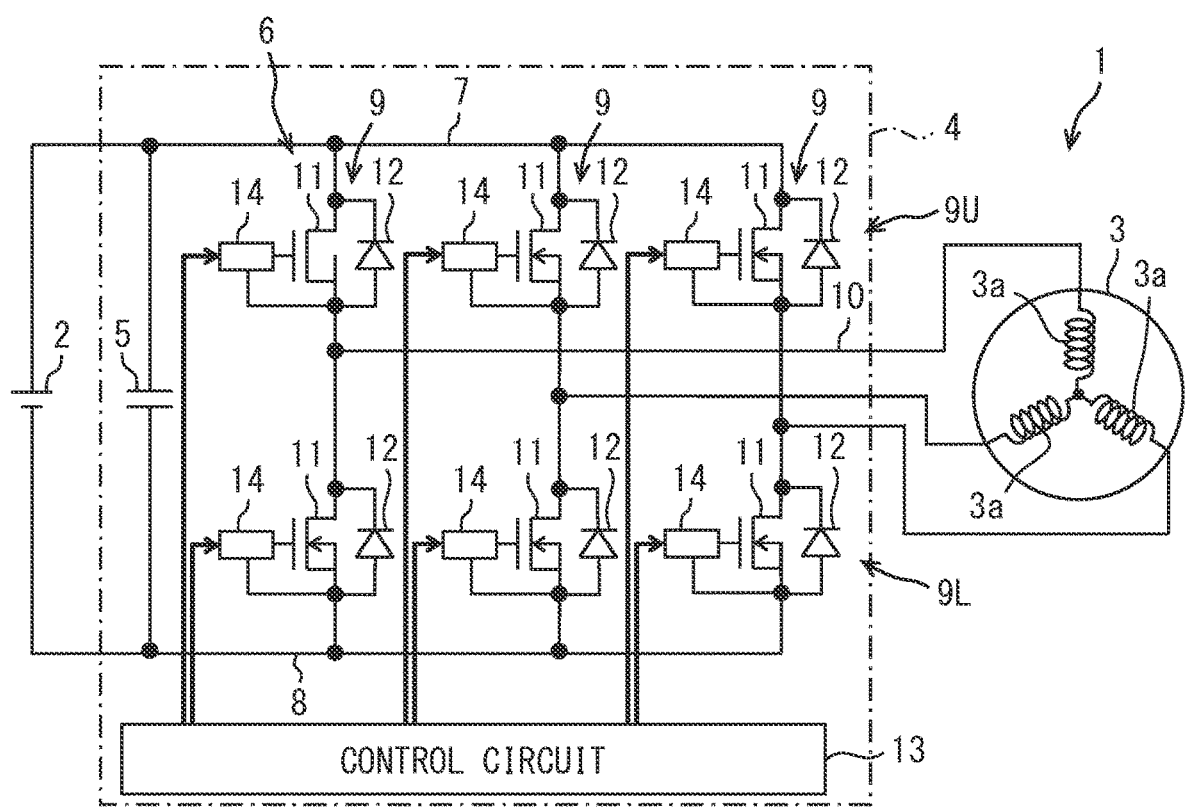
FIG. 1 is a diagram illustrating a circuit configuration of a power conversion device according to a first embodiment.

In an assumable example, a power conversion device includes a semiconductor module, a dummy module, and a cooler unit including a plurality of heat exchange portions having a flow path through which a refrigerant flows. The dummy module is arranged side by side with the semiconductor module. The heat exchange portion is arranged so as to sandwich each of the semiconductor module and the dummy module from both sides.

A power conversion circuit is electrically connected to a capacitor (for example, a smoothing capacitor). A temperature of the capacitor rises due to self-heating due to ripple current, heat generation of the semiconductor module constituting the power conversion device, or the like. As the temperature rises, a life of the capacitor becomes shorter. From the viewpoint described above or from other unmentioned viewpoints, there is demand for further improvement to the electric conversion device.

One object disclosed is to provide a power conversion device with a long capacitor life.

The power conversion device disclosed herein includes
a semiconductor module group including a plurality of semiconductor modules having at least one semiconductor element constituting a power conversion circuit and at least one main terminal electrically connected to the semiconductor element, at least one dummy module that does not have a semiconductor element and is arranged side by side with at least some semiconductor modules, a cooler unit including a plurality of heat exchange portion having a flow path through which the refrigerant flows respectively and being configured to arrange so as to sandwich each of the semiconductor module and the dummy module from both sides in an arrangement direction of the semiconductor module and the dummy module, a capacitor, and at least one bus bar that electrically connects the capacitor and the main terminal.

The dummy module has at least one metal body and at least one dummy terminal which continues from the metal body and is connected to the bus bar. The metal body forms at least a part of the surface of the dummy module sandwiched by the heat exchange portion.

The disclosed power conversion device includes the dummy module. The metal body of the dummy module forms at least a part of the surface sandwiched by the heat exchange portion. The dummy terminal continues from the metal body and is connected to the bus bar. Therefore, the metal body is cooled by the heat exchange portion having the flow path, and the temperature of the bus bar is also lowered via the dummy terminal. As a result, the capacitor can be cooled via the metal body, the dummy terminal, and the bus bar, and the temperature rise of the capacitor can be suppressed. As a result, it is possible to provide a power conversion device having a long capacitor life.

The disclosed aspects in this specification adopt different technical solutions from each other in order to achieve their respective objectives. The objects, features, and advantages disclosed in this specification will become apparent by referring to following detailed descriptions and accompanying drawings.

Hereinafter, multiple embodiments will be described with reference to the drawings. In the multiple embodiments, functionally and/or structurally corresponding parts are given the same reference numerals. A power conversion device shown below can be applied to a moving body whose drive source is a rotary electric machine. The moving body is, for example, a vehicle such as an electric vehicle (EV), a hybrid vehicle (HV), a fuel cell vehicle (FCV), a flying object such as a drone, a ship, a construction machine, or an agricultural machine.

First Embodiment

First, a schematic configuration of a vehicle drive system to which a power conversion device is applied will be described with reference to FIG. 1.

<Vehicle Drive System>

As shown in FIG. 1, a vehicle drive system 1 is provided with a DC power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The electric power conversion device 4 performs electric power conversion between the DC power supply 2 and the motor generator 3.

<Circuit Configuration of Power Conversion Device>

Next, a circuit configuration of the power conversion device 4 will be described with reference to FIG. 1. The power conversion device 4 includes at least a power conversion circuit and a capacitor. The power conversion device 4 of the present embodiment includes a smoothing capacitor 5, an inverter 6, a control circuit 13, and a drive circuit 14. The inverter 6 corresponds to a power conversion circuit, and the smoothing capacitor 5 corresponds to a capacitor.

The smoothing capacitor 5 mainly smooths the DC voltage supplied from the DC power supply 2. The smoothing capacitor 5 is connected between a P line 7 which is a power line on a high potential side and a N line 8 which is a power line on a low potential side. The P line 7 is connected to a positive electrode of the DC power supply 2, and the N line 8 is connected to a negative electrode of the DC power supply 2. The positive electrode of the smoothing capacitor 5 is connected to the P line 7 between the DC power supply 2 and the inverter 6. Similarly, the negative electrode thereof is connected to the N line 8 between the DC power supply 2 and the inverter 6.

The inverter 6 corresponds to a DC-AC conversion circuit. The inverter 6 includes upper and lower arm circuits 9 for three phases. Each of the upper and lower arm circuits 9 has an upper arm 9U and a lower arm 9L. The upper arm 9U and the lower arm 9L are connected in series between the P line 7 and the N line 8 with the upper arm 9U adjacent to the P line 7. A connection point between the upper arm 9U and the lower arm 9L is connected to the winding 3a of the corresponding phase in the motor generator 3 via an output line 10. The inverter 6 has six arms.

Each arm has a MOSFET 11 as a switching element and a diode 12. The diode 12 is connected in anti-parallel (i.e., reversely) to the MOSFET 11 for reflux. The diode 12 may be a parasitic diode (i.e., a body diode) of the MOSFET 11 or may be provided separately from the parasitic diode. The MOSFET 11 and the diode 12 are formed on a semiconductor substrate. A semiconductor substrate (semiconductor chip) on which the MOSFET 11 and the diode 12 are formed corresponds to a semiconductor element.

In the present embodiment, the MOSFET 11 is a n-channel type. In the MOSFET 11, a drain is a main electrode on a high potential side, and a source is a main electrode on a low potential side. The MOSFET 11 is formed on, for example, Si (silicon) or a semiconductor substrate having a wide bandgap having a bandgap larger than that of Si. Examples of wide bandgap semiconductors include SiC (silicon carbide), GaN (gallium nitride), and diamond. The MOSFET 11 of the present embodiment is formed on a SiC substrate.

In the upper arm 9U, the drain is connected to the P line 7. In the lower arm 9L, the source is connected to the N line 8. The source on the upper arm 9U side and the drain on the lower arm 9L side are connected to each other. The anode of the diode 12 is connected to the source of the corresponding MOSFET 11, and the cathode thereof is connected to the drain.

The inverter 6 converts the DC voltage into a three-phase AC voltage according to a switching control by the control circuit 13 and outputs the three-phase AC voltage to the motor generator 3. Thereby, the motor generator 3 is driven to generate a predetermined torque. At the time of regenerative braking of the vehicle, the inverter S converts the three-phase AC voltage generated by the motor generator 3 by receiving the rotational force from the wheels into a DC voltage according to the switching control by the control circuit 13, and outputs the DC voltage to the P line 7. In this way, the inverter 6 performs bidirectional power conversion between the DC power supply 2 and the motor generator 3.

The control circuit 13 generates a drive command for operating the MOSFET 11 and outputs the drive command to the drive circuit 14. The control circuit 13 generates the drive command based on a torque request input from a higher-level ECU (not shown) or signals detected by various sensors. Various sensors include, for example, a current sensor, a rotation angle sensor, and a voltage sensor. The current sensor detects the phase current flowing through the winding 3a of each phase. The rotation angle sensor detects a rotation angle of a rotor of the motor generator 3. The voltage sensor detects the voltage across the smoothing capacitor 5. The power conversion device 4 includes these sensors (not shown). The control circuit 13 outputs a PWM signal as a drive command. The control circuit 13 includes, for example, a computer (microcomputer). ECU is an abbreviation for Electronic Control Unit. PWM is an abbreviation for Pulse Width Modulation.

The drive circuit 14 supplies a drive voltage to the gate of the MOSFET 11 of the corresponding arm based on the drive command of the control circuit 13. The drive circuit 14 drives the corresponding MOSFET 11 by applying a drive voltage to turn on and off the drive of the corresponding MOSFET 11. The drive circuit 14 may also be referred to as a driver. In the present embodiment, one drive circuit 14 is provided for one arm.

The power conversion device 4 may further include a converter as a power conversion circuit. The converter is a DC-DC converter circuit for converting the DC voltage to a DC voltage with different value. The converter is provided between the DC power supply 2 and the smoothing capacitor 5. The converter is configured to include, for example, a reactor and the above-mentioned upper and lower arm circuits 9. The power conversion device 4 may further include a filter capacitor for removing power supply noise from the DC power supply 2. The filter capacitor is provided between the DC power supply 2 and the converter.

The example in which the power conversion device 4 includes the control circuit 13 is shown, but the present embodiment may not be limited thereto. For example, by giving the function of the control circuit 13 to the upper ECU, the power conversion device 4 may not include the control circuit 13. The example in which the drive circuit 14 is provided for each arm has been shown, but the present embodiment may not be limited to this configuration. For example, one drive circuit 14 may be provided for one upper and lower arm circuit 9.

<Configuration of Power Conversion Device>

Next, the schematic structure of the power conversion device 4 will be described with reference to FIGS. 2 to 7. In the following, a laminating direction of the laminated body 40 is referred to as a X direction. A direction orthogonal to the X direction and extending a main terminal 55 is indicated as a Z direction. A direction orthogonal to the X direction and the Z direction is defined as a Y direction.

Figure 2:
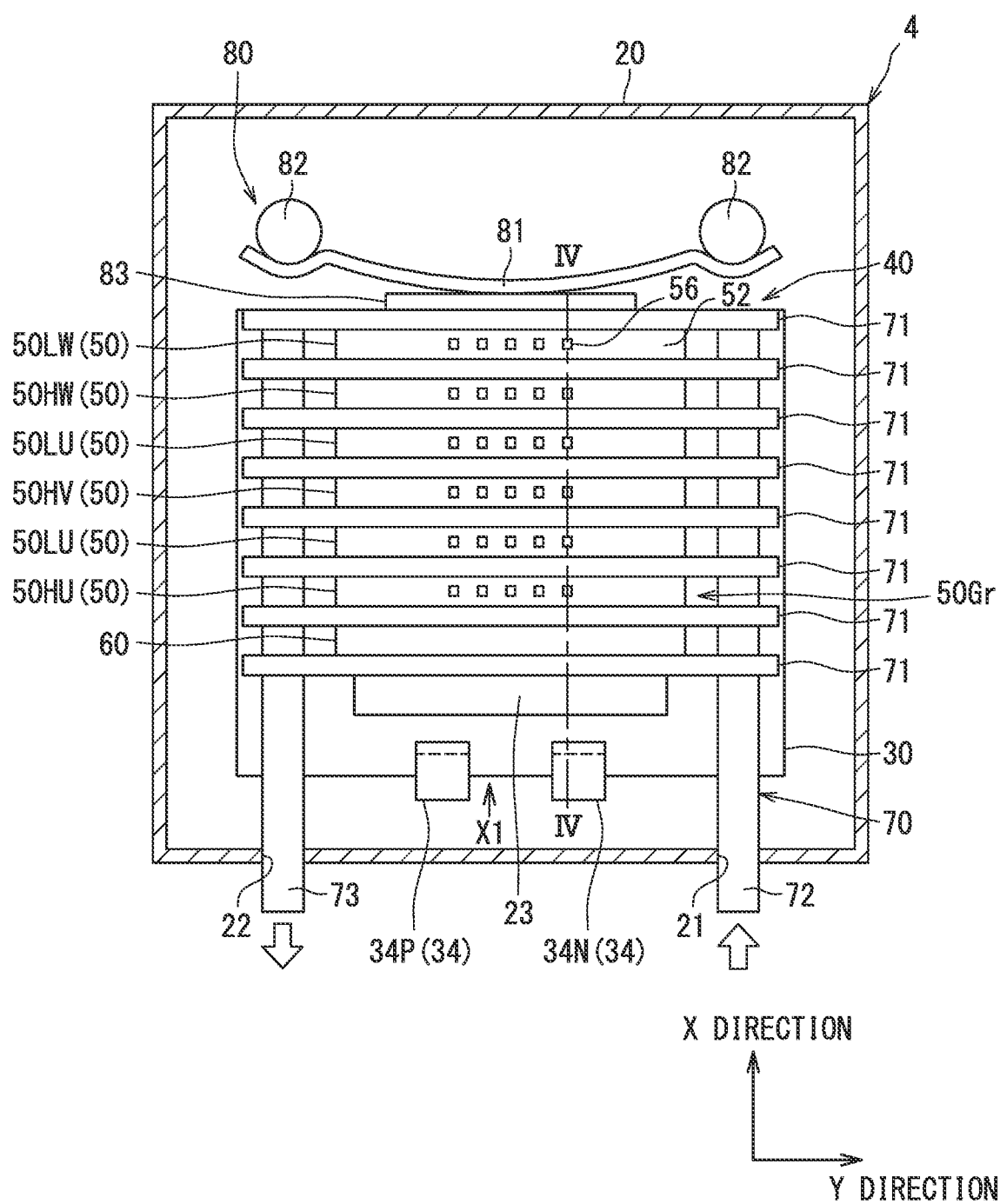
FIG. 2 is a partial cross-sectional view showing a structure of a power conversion device.
Figure 3:
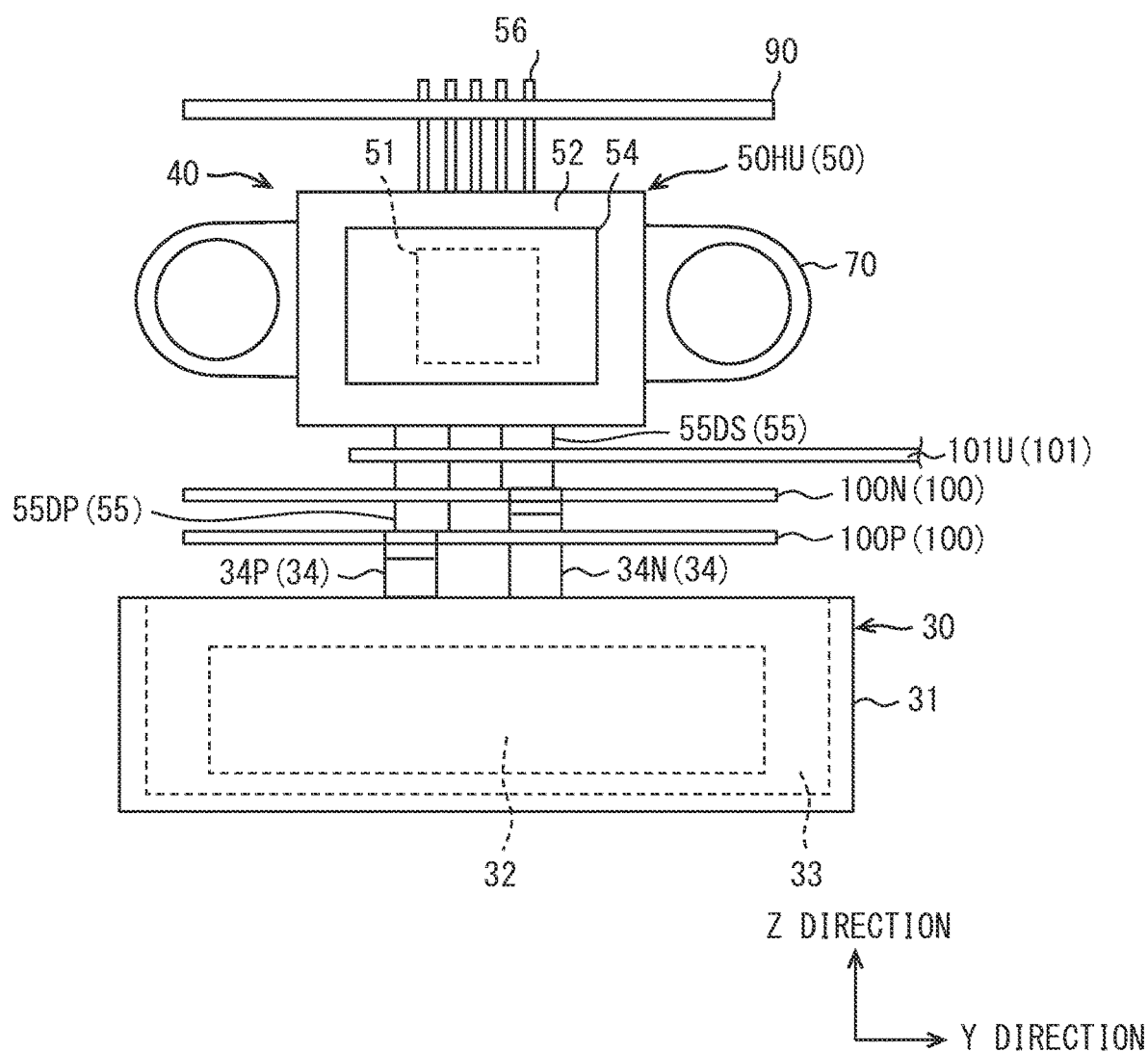
FIG. 3 is a plan view showing a structure inside the case as viewed from a X1 direction.
Figure 4:
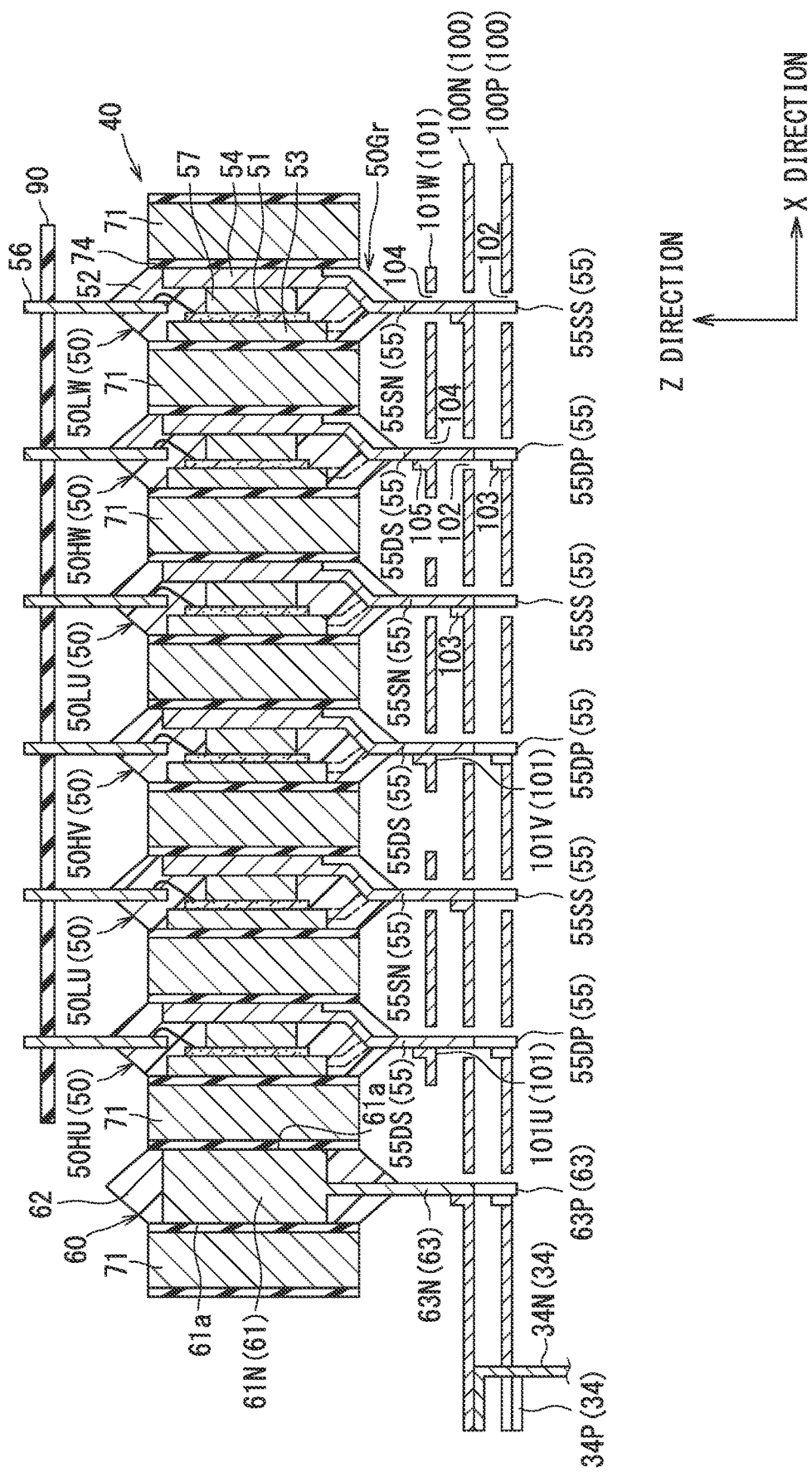
FIG. 4 is a cross-sectional view taken along the IV-IV line of FIG. 2.
Figure 5:
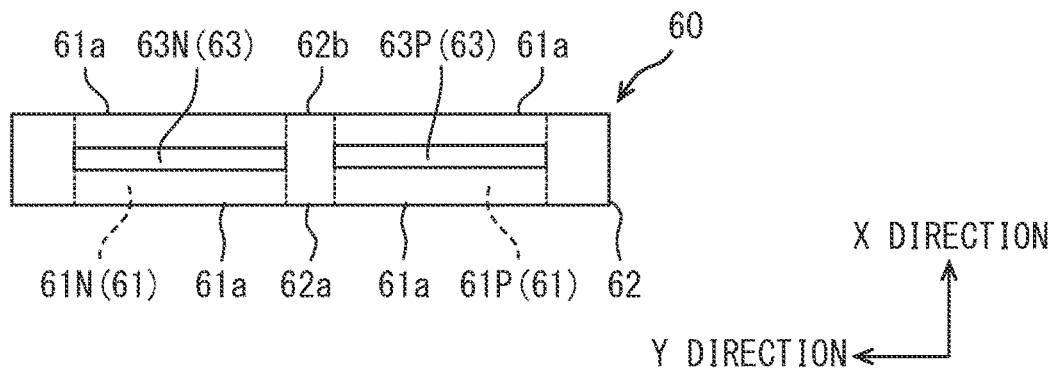
FIG. 5 is a plan view of a dummy module as seen from a dummy terminal side.
Figure 6:
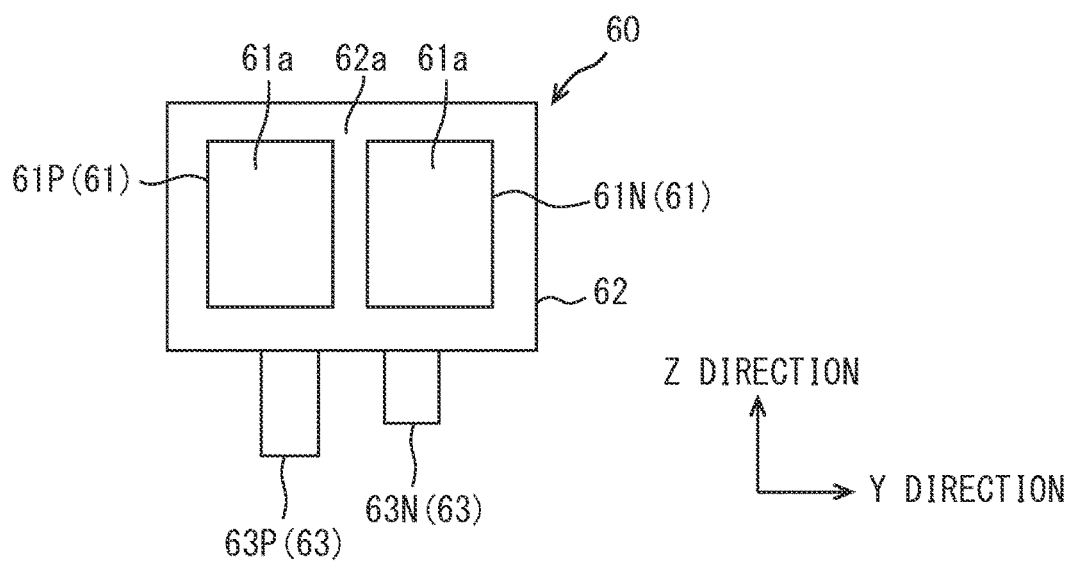
FIG. 6 is a plan view of the dummy module seen from the X1 direction.

In FIG. 2, in order to show an inside of the case 20, the case 20 is shown in cross section and the other elements are shown in a plane. In FIG. 2, the circuit board 90 and the bus bar 100 are omitted for convenience. FIG. 3 is a plan view showing the structure inside the case as viewed from the X1 direction. In FIG. 3, for convenience, the semiconductor module 50 (50HU) is shown as the laminated body 40. FIG. 4 is a cross-sectional view taken along a line IV-IV of FIG. 2. In FIG. 4, for convenience, only the terminal 34 of the capacitor module 30 is shown, and the heat exchange portion 71 is shown in a simplified manner. FIGS. 5 and 6 are plan views showing the dummy module 60.

As shown in FIGS. 2 and 3, the power conversion device 4 includes a case 20, a capacitor module 30, the laminated body 40 including a semiconductor module 50, a dummy module 60, and a cooler 70, a pressurizing member 80, a circuit board 90, and a bus bar 100. In addition to the above elements, the power conversion device 4 includes an input terminal block, an output terminal block, and the like (not shown).

The case 20 has a box shape to accommodate other elements constituting the power conversion device 4. The case 20 is, for example, a molded body made of die-cast aluminum. The case 20 of the present embodiment has a substantially rectangular parallelepiped shape. The case 20 is configured by assembling a plurality of members (for example, two). The case 20 has a through hole 21 through which an introduction pipe 72 is inserted and a through hole 22 through which a discharge pipe 73 is inserted. The through holes 21 and 22 are provided on a common side surface in the case 20. The through holes 21 and 22 penetrate inside and outside on the side surface of the case 20, and are open to the inner surface and the outer surface. The through holes 21 and 22 are formed, for example, by grinding with a cutting tool. When an opening that penetrates inside and outside is formed by a plurality of members, the opening corresponds to the through holes 21 and 22.

A sealing member (not shown) for water tightly sealing around the through holes 21 and 22 is respectively arranged between a wall surface of the through hole 21 and the introduction pipe 72, and between a wall surface of the through hole 22 and the discharge pipe 73. As the sealing member, an elastic member such as a grommet, an adhesive for sealing, or the like can be used.

The case 20 has a support portion 23. The support portion 23 supports the laminated body 40 composed of the semiconductor module 50, the dummy module 60, and the heat exchange portion 71 in the X direction. The support portion 23 supports the laminated body 40 pressed in the X direction by the pressurizing member 80, In the present embodiment, the case 20 has a convex portion protruding from an inner surface as the support portion 23. The support portion 23 is provided on an upper wall of the case 20, for example.

As shown in FIG. 3, the capacitor module 30 includes a capacitor case 31, a capacitor element 32, a sealing resin body 33, and terminals 34. The capacitor module 30 corresponds to the capacitor. The capacitor case 31 is formed of a resin material or a metal material, and has a box shape with one side open. The capacitor element 32 is housed (arranged) in the capacitor case 31. The capacitor element 32 constitutes the smoothing capacitor 5 described above. As the capacitor element 32, for example, a film capacitor element can be adopted. The number of capacitor elements 32 housed in the capacitor case 31 is not particularly limited. The number may be only one or multiple.

The sealing resin body 33 is arranged in the capacitor case 31 so as to seal the capacitor element 32. The resin constituting the sealing resin body 33 is filled up to a vicinity of the opening surface of the capacitor case 31, for example. As the resin material, for example, an epoxy resin can be adopted.

The terminals 34 are terminal portions for external connection connected to the bus bar 100 in the capacitor module 30. The terminals 34 are, for example, portions of the plate-shaped metal member connected to the metal electrode of the capacitor element 32 that protrudes outward from the sealing resin body 33. The metal member including the terminals 34 may be referred to as a bus bar on the capacitor side. The terminals 34 have a positive electrode terminal 34P connected to a positive electrode bus bar 100P and a negative electrode terminal 34N connected to a negative electrode bus bar 100N. The positive electrode terminal 34P corresponds to the positive electrode of the capacitor, and the negative electrode terminal 34N corresponds to the negative electrode of the capacitor. The positive electrode terminal 34P is connected to the metal electrode on the positive electrode side of the capacitor element 32 via the main body portion (not shown) of the metal member on the positive electrode side. The negative electrode terminal 34N is connected to the metal electrode on the negative electrode side of the capacitor element 32 via the main body portion (not shown) of the metal member on the negative electrode side.

Each of the terminals 34 projects out of the sealing resin body 33 and extends in the Z direction. The protruding tip of the terminal 34 is bent in the X direction, and the bent portion is connected to the corresponding bus bar 100. In addition to the terminals 34, the capacitor module 30 includes a terminal (not shown, hereinafter referred to as an input terminal) for connecting the capacitor element 32 to the DC power supply 2. The input terminal is configured as, for example, a part of a metal member including the terminal 34. The input terminal is connected to the DC power supply 2 via an input terminal block (not shown).

The above-mentioned capacitor module 30 is arranged on a wall portion opposite to the wall portion where the support portion 23 is provided in the case 20, for example, on the bottom wall. As shown in FIG. 2, the capacitor module 30 is arranged directly below the laminated body 40 in a plan view from the Z direction.

As shown in FIGS. 2 and 4, the laminated body 40 includes the semiconductor module 50, the dummy module 60, and the heat exchange portion 71 of the cooler 70.

As shown in FIGS. 2 to 4, the semiconductor module 50 includes a semiconductor element 51, a sealing resin body 52, heat sinks 53 and 54, a main terminal 55, and a signal terminal 56. The semiconductor element 51 constitutes the above-mentioned inverter 6 (power conversion circuit). The semiconductor element 51 is formed by forming an element on a semiconductor substrate made of silicon (Si), a wide-bandgap semiconductor having a wider bandgap than silicon, or the like Examples of the wide bandgap semiconductor include silicon carbide (SiC), gallium nitride (GaN), gallium oxide (Ga2O3), and diamond. The semiconductor element 51 may be referred to as a semiconductor chip.

The MOSFET 11 (switching element) constituting the inverter 6 is formed on the semiconductor element 51. The semiconductor element 51 has main electrodes (not shown) on both sides in the plate thickness direction of the semiconductor element 51. Specifically, the semiconductor element 51 has a source electrode on the front surface side and a drain electrode on the back surface side as main electrodes. In the semiconductor element 51, a pad (not shown), which is an electrode for the signal terminal 56, is formed on the forming surface of the source electrode. The plate thickness direction of the semiconductor element 51 is substantially parallel to the X direction.

The sealing resin body 52 seals the semiconductor element 51. The sealing resin body 52 is made of, for example, an epoxy resin, and is molded by transfer molding, potting, or the like.

The heat sinks 53 and 54 are arranged so as to sandwich the semiconductor element 51 and are electrically connected to the semiconductor element 51. The heat sinks 53 and 54 are heat radiating members for radiating the heat generated by the semiconductor element 51 to the outside. The heat sinks 53 and 54 are wiring members that electrically relay the main electrode and the main terminal 55. As the heat sinks 53 and 54, for example, a metal plate made of Cu, a Cu alloy, or the like, a DBC (Direct Bonded Copper) substrate, or the like can be adopted. A plating film such as Ni or Au may be provided on the surface.

The heat sink 53 is connected to the drain electrode of the semiconductor element 51 via a bonding material (not shown) such as solder. The heat sink 54 is connected to the source electrode of the semiconductor element 51 via a bonding material (not shown), In the present embodiment, the terminal 57 is interposed between the source electrode and the heat sink 54 in order to secure the height of the bonding wire connecting the pad and the signal terminal 56. As the material of the terminal 57, the same material as the heat sinks 53 and 54 can be used. The terminal 57 is sometimes referred to as a metal block. Instead of the terminal 57, the heat sink 54 may be provided with a convex portion.

The inner surfaces of the heat sinks 53 and 54 are mounting surfaces of the semiconductor element 51. The outer surfaces of the heat sinks 53 and 54 are exposed from the sealing resin body 52. The heat sinks 53 and 54 are exposed from the sealing resin body 52 in the plate thickness direction of the semiconductor element 51. The semiconductor module 50 is sandwiched by the heat exchange portions 71 from both sides in the plate thickness direction of the semiconductor element 51, that is, in the X direction.

The main terminal 55 is a terminal for external connection that is electrically connected to the main electrode. The signal terminal 56 is a terminal for external connection that is electrically connected to the pad. The main terminal 55 and the signal terminal 56 are extended in opposite directions. The main terminal 55 extends to the capacitor module 30 side in the Z direction, and the signal terminal 56 extends to the circuit board 90 side.

The main terminal 55 has a positive electrode terminal 55DP and an output terminal 55DS connected to a drain electrode via the heat sink 53, and a negative electrode terminal 55SN and an output terminal 55SS connected to a source electrode via the heat sink 54. The positive electrode terminal 55DP is a terminal connected to a positive electrode bus bar 100P, and the negative electrode terminal 55SN is a terminal connected to a negative electrode bus bar 100N. The output terminals 55DS and 55SS are terminals that connect the upper arm 9U and the lower arm 9L of the same phase and are connected to an output bus bar 101.

Each of the semiconductor modules 50 includes a total of two main terminals 55, one drain terminal and one source terminal. The two main terminals 55 are arranged side by side in a direction orthogonal to the extending direction of the main terminal 55 and the plate thickness direction of the semiconductor element 51. As shown in FIGS. 3 and 4, The protrusion length from the sealing resin body 52 at the drain terminal (55DP, 55DS) is longer than that at the source terminal (553N, 55SS).

The power conversion device 4 includes a semiconductor module group 50Gr. The semiconductor module group 50Gr includes a plurality of semiconductor modules 50 constituting the inverter 6. The semiconductor module group 50Gr includes the semiconductor modules 50HU and 50LU constituting the U-phase upper and lower arm circuits 9, the semiconductor modules 50HV and 50LV constituting the V-phase upper and lower arm circuits 9, and the semiconductor modules 50HW and 50LW constituting the W-phase upper and lower arm circuits 9. The semiconductor modules 50HU, 50HV and 50HW form the upper arm 9U in each phase, and the semiconductor modules 50LU, 50LV and 50LW form the lower arm 9L in each phase.

In the semiconductor modules 50HU, 50HV, and 50HW, the drain terminal is the positive electrode terminal 55DP, and the source terminal is the output terminal 55SS. In the semiconductor modules 50LU, 50LV, and 50LW, the drain terminal is the output terminal 55DS, and the source terminal is the negative electrode terminal 55SN.

The dummy module 60 is a module that does not constitute the upper and lower arm circuit 9 and thus the inverter 6 (power conversion circuit). The dummy module 60 does not have the semiconductor element 51. As shown in FIGS. 4, 5, 6, and the like, the dummy module 60 includes a metal body 61, a sealing resin body 62, and a dummy terminal 63.

The metal body 61 is formed in a plate shape or a block shape, for example, by using a metal material having good thermal conductivity such as Cu and aluminum. The metal body 61 is arranged so as to form at least a part of the surface sandwiched by the heat exchange portion 71 in the dummy module 60. The sealing resin body 62 seals the metal body 61. Like the sealing resin body 52, the sealing resin body 62 is molded by transfer molding, potting, or the like. A part of the metal body 61 is exposed from the sealing resin body 62 so as to form at least a part of the surface sandwiched by the heat exchange portion 71. The dummy terminal 63 continues from the metal body 61 and is connected to the bus bar 100 like the main terminal 55. The dummy terminal 63 protrudes outside the sealing resin body 52 and extends in the same direction as the main terminal 55.

In the present embodiment, the metal body 61 has a metal body 61P on the positive electrode side and a metal body 61N on the negative electrode side. The two metal bodies 61 (61P, 61N) each have a substantially rectangular parallelepiped shape. The metal bodies 61P and 61N have the same structure as each other and are arranged side by side in the Y direction. The sealing resin body 62 integrally holds the metal bodies 61P and 61N. The sealing resin body 62 has one surface 62a and a back surface 62b as surfaces sandwiched by the heat exchange portion 71, The back surface 62b is the opposite surface to the one surface 62a. The thicknesses of the metal bodies 61P and 61N are substantially equal to the thickness of the sealing resin body 62. The metal body 61P corresponds to the first metal body, and the metal body 61N corresponds to the second metal body. The one surface 62a corresponds to a first surface, and the back surface 62b corresponds to a second surface.

Both the metal bodies 61P and 61N are exposed on the one surface 62a and the back surface 62b, respectively. The metal body 61 has an exposed surface 61a. The exposed surface 61a is, for example, substantially flush with the one surface 62a and the back surface 62b. The exposed surface 61a has a substantially rectangular shape in a plane, and a long side is substantially parallel to the Z direction and a short side is substantially parallel to the Y direction. The dummy module 60 has two exposed surfaces 61a on the one side 62a side and two exposed surfaces 61a on the back surface 62b side. The two exposed surfaces 61a are in a positional relationship of overlapping each other in a plan view from the X direction. Of the surfaces of the metal body 61 (61P, 61N), the surfaces other than the exposed surface 61a are sealed (coated) by the sealing resin body 62.

The dummy terminal 63 has a dummy terminal 63P on the positive electrode side and a dummy terminal 63N on the negative electrode side. The dummy terminal 63P is a terminal connected to the positive electrode bus bar 100P and continues from the metal body 61P. The dummy terminal 63N is a terminal connected to the negative electrode bus bar 100N and continues from the metal body 61N. The dummy terminals 63P and 63N continues from the surface on the capacitor module 30 side in the corresponding metal bodies 61P and 61N and extend in the Z direction. The dummy terminals 63P and 63N are arranged side by side in the Y direction like the two main terminals 55 of the semiconductor module 50. The protrusion length from the sealing resin body 62 of the dummy terminal 63P is longer than that of the dummy terminal 63N. The dummy terminal 63P corresponds to a first dummy terminal, and the dummy terminal 63N corresponds to a second dummy terminal.

As described above, the dummy module 60 of the present embodiment has the dummy terminal 63 connected to the bus bar 100. The dummy terminal 63P corresponds to the main terminal 55 (55DP, 55DS) on the drain side of the semiconductor module 50, and the dummy terminal 63N corresponds to the main terminal 55 (55SN, 553S) on the source side. The dummy module 60 has substantially the same length, that is, thickness as the semiconductor module 50 in the X direction. The dummy module 60 is arranged side by side with the semiconductor module 50. In this embodiment, the power conversion device 4 includes one dummy module 60.

The cooler 70 is formed of a material having excellent thermal conductivity, for example, an aluminum-based material. The cooler 70 includes a heat exchange portion 71, an introduction pipe 72, a discharge pipe 73, and an insulating member 74. The heat exchange portion 71 is housed in the case 20. The heat exchange portion 71 is a flat tubular body as a whole. The heat exchange portion 71 processes, for example, at least one of a pair of plates (thin metal plates) into a shape bulging in the X direction by press working. After that, the outer peripheral edges of the pair of plates are fixed to each other by caulking or the like, and are joined to each other on the entire circumference by brazing or the like. As a result, a flow path through which the refrigerant can flow is formed between the pair of plates, and the flow path can be used as the heat exchange portion 71.

The heat exchange portion 71 is alternately laminated with a plurality of modules including the semiconductor module 50 and the dummy module 60. In this way, the semiconductor module 50, the dummy module 60, and the laminated body 40 of the heat exchange portion 71 are formed. The modules (semiconductor module 50 and dummy module 60) and the heat exchange portion 71 are arranged side by side in the X direction. The laminating direction of the laminated body 40 is the X direction. Each of the semiconductor modules 50 is sandwiched by the heat exchange portions 71 in the X direction. The dummy module 60 is also sandwiched by the heat exchange portions 71 in the X direction. In the laminated body 40, both ends in the X direction are heat exchange portions 71. The laminating direction corresponds to the arrangement direction.

Each of the introduction pipe 72 and the discharge pipe 73 is arranged inside and outside the case 20. Each of the introduction pipe 72 and the discharge pipe 73 may be configured by one member or may be configured by connecting a plurality of members. The introduction pipe 72 and the discharge pipe 73 are connected to each of the heat exchange portions 71. By supplying the refrigerant to the introduction pipe 72 by a pump (not shown), the refrigerant flows in the flow path in the laminated heat exchange portion 71. As a result, each of the semiconductor modules 50 constituting the laminated body 40 is cooled by the refrigerant. Similarly, the dummy module 60 is also cooled by the refrigerant. The refrigerant flowing through each of the heat exchange portions 71 is discharged through the discharge pipe 73. As the refrigerant, a phase-changing refrigerant such as water or ammonia or a non-phase-changing refrigerant such as ethylene glycol can be used.

Each of the insulating members 74 is interposed between the heat exchange portion 71 and the semiconductor module 50, and between the heat exchange portion 71 and the dummy module 60, and the heat exchange portion 71 and the semiconductor module 50, and the heat exchange portion 71 and the dummy module 60 are electrically separated. As the insulating member 74, for example, a ceramic plate, a grease or gel-like heat conductive member, and a combination thereof can be adopted. The cooler 70 may further have a fixing member (not shown). The fixing member fixes the introduction pipe 72 and/or the discharge pipe 73 to the case 20 between the side wall of the case 20 in which the through holes 21 and 22 are formed and the heat exchange portion 71. As the fixing member, for example, a clamp can be adopted.

The pressurizing member 80 has an elastic member 81, support members 82, and a contact plate 83. The elastic member 81 is provided between a side wall surface (hereinafter referred to as the facing wall) opposite to the side wall surface on which the through holes 21 and 22 are formed in the case 20 and the laminated body 40. The laminated body 40 is held in a fixed position in the case 20 by the elastic member 81. In the present embodiment, a curved leaf spring is used as the elastic member 81. As the elastic member 81 in addition to a metal spring, a member that generates a pressing force due to elastic deformation such as rubber can be adopted.

The support members 82 are provided between the elastic member 81 and the facing wall of the case 20. The pressurizing member 80 has two support members 82. The two support members 82 are provided apart from each other in the Y direction. Both ends of the elastic member 81 are supported by the two support members 82. The elastic member 81 presses the laminated body 40 at the center in the Y direction. The support member 82 is fixed to, for example, a wall portion on the same side as the support portion 23 in the case 20. The elastic member 81 is supported at a position floating from the wall portion (case 20).

The contact plate 83 has a flat plate shape. The contact plate 83 is arranged between the elastic member 81 and the laminated body 40. The contact plate 83 is in surface contact with the heat exchange portion 71 forming one end of the laminated body 40. The elastic member 81 presses the laminated body 40 via the contact plate 83 in a state where the heat exchange portion 71 forming the other end of the laminated body 40 is supported by the support portion 23.

Although not shown, the circuit board 90 includes a wiring board in which wiring is arranged on an insulating base material such as resin, electronic components mounted on the wiring board, connectors, and the like. The circuit is composed of mounted electronic components and wiring. The control circuit 13 and the drive circuit 14 described above are formed on the circuit board 90.

As shown in FIGS. 3 and 4, the circuit board 90 is arranged on the side opposite to the capacitor module 30 with respect to the laminated body 40. For example, assuming that the capacitor module 30 side is the lower side with respect to the laminated body 40, the circuit board 90 is arranged on the upper side of the laminated body 40. In a plan view from the Z direction, the circuit board 90 is arranged so as to overlap the laminated body 40, particularly the semiconductor module 50. The signal terminal 56 of the semiconductor module 50 included in the laminated body 40 is connected to the circuit board 90.

The bus bar 100 is a wiring member that electrically connects the capacitor module 30 and the semiconductor module 50. The bus bar 100 is a plate-shaped metal member. The bus bar 100 is connected to the corresponding terminal by solder joining, resistance welding, laser welding, or the like. As shown in FIGS. 3 and 4, the bus bar 100 has a positive electrode bus bar 100P constituting the above-mentioned P line 7 and a negative electrode bus bar 100N constituting the N line 8.

The positive electrode bus bar 100P is connected to each of the positive electrode terminal 34P of the capacitor module 30, the positive electrode terminal 55DP of the semiconductor module 50, and the dummy terminal 63P of the dummy module 60. The negative electrode bus bar 100N is connected to each of the negative electrode terminal 34N of the capacitor module 30, the negative electrode terminal 55SN of the semiconductor module 50, and the dummy terminal 63N of the dummy module 60. In the present embodiment, most of the positive electrode bus bar 100P and the negative electrode bus bar 100N face each other in the plate thickness direction. The plate thickness direction of the bus bar 100 is substantially parallel to the Z direction. In the Z direction, the positive electrode bus bar 100P is arranged on the capacitor module 30 side, and the negative electrode bus bar 100N is arranged on the laminated body 40 side.

The bus bar 100 (100P, 100N) has a plurality of through holes 102 and a connection portion 103 provided around a part of the through holes 102. The through hole 102 penetrates the bus bar 100 in the plate thickness direction. The connection portion 103 is provided around the through hole 102 in the bus bar 100. For example, the connection portion 103 is bent along the wall surface of the through hole 102 at an angle of approximately 90 degrees with respect to the bus bar 100.

The positive electrode bus bar 100P is provided with a plurality of through holes 102 corresponding to the main terminal 55 (55DP, 55DS) on the drain side of the semiconductor module 50 and the dummy terminal 63P on the positive electrode side of the dummy module 60. As described above, since the main terminal 55 (55SN, 55SS) on the emitter side is short, the positive electrode bus bar 100P located at a position away from the laminated body 40 is not provided with the through hole corresponding to the main terminal 55 (55SN, 55SS) on the emitter side. In the present embodiment, one through hole 102 is provided for one terminal. The connection portion 103 is provided corresponding to the positive electrode terminal 55DP and the dummy terminal 63P. Each of the positive electrode terminal 55DP and the dummy terminal 63P is connected to the connection portion 103 in a state of being inserted into the corresponding through hole 102. The positive electrode terminal 55DP and the dummy terminal 63P are inserted through, for example, the through hole 102.

The through hole 102 into which the output terminal 55DS is inserted is provided to avoid contact between the positive electrode bus bar 100P and the output terminal 55DS, that is, to secure electrical insulation. The positive electrode bus bar 100P of the present embodiment has seven through holes 102 corresponding to six main terminals 55 on the drain side and one dummy terminal 63 (93P). Further, the positive electrode bus bar 100P has four connection portions 103 corresponding to three positive electrode terminals 55DP and one dummy terminal 63P. The seven through holes 102 are arranged in the X direction at a predetermined pitch.

The negative electrode bus bar 100N is provided with a number of through holes 102 corresponding to all the main terminals 55 of the semiconductor module 50 and all the dummy terminals 63. In the present embodiment, one through hole 102 is provided for one terminal. The connection portion 103 is provided corresponding to the negative electrode terminal 55SN and the dummy terminal 63N on the negative electrode side. Each of the negative electrode terminal 55SN and the dummy terminal 63N is connected to the connection portion 103 in a state of being inserted into the corresponding through hole 102. The negative electrode terminal 55SN and the dummy terminal 63N may be inserted through the through hole 102, or the tip thereof may be arranged in the through hole 102.

The through hole 102 into which the positive electrode terminal 55DP and the output terminals 55DS and 55SS are inserted is provided to avoid contact between the negative electrode bus bar 100N and the positive electrode terminal 55DP and the output terminals 55DS and 55SS, that is, to secure electrical insulation. The positive electrode terminal 55DP, which is drain terminal, and the output terminal 55DS is inserted through the corresponding through holes 102. The output terminal 55SS, which is a source terminal, may be inserted through the through hole 102, or its tip may be arranged in the through hole 102.

The negative electrode bus bar 100N of the present embodiment has fourteen (14) through holes 102 corresponding to all the main terminals 55 and all the dummy terminals 63. Further, the negative electrode bus bar 100N has four connection portions 103 corresponding to three negative electrode terminals 55SN and one dummy terminal 63N.

The output bus bar 101 is a wiring member that electrically connects the semiconductor module 50 and an output terminal block (not shown). The output bus bar 101 is a plate-shaped metal member. The output bus bar 101 is connected to the corresponding output terminals 55DS and 55SS by solder joining, resistance welding, laser welding and the like. A part of the output bus bar 101 overlaps with the laminated body 40 and the bus bar 100 in a plan view from the Z direction, and extends from this overlapping portion in a direction (Y direction) orthogonal to the laminating direction (X direction) of the laminated body 40. The overlapping portion of the output bus bar 101 is arranged on the laminated body 40 side with respect to the bus bar 100 in the Z direction.

Figure 7:
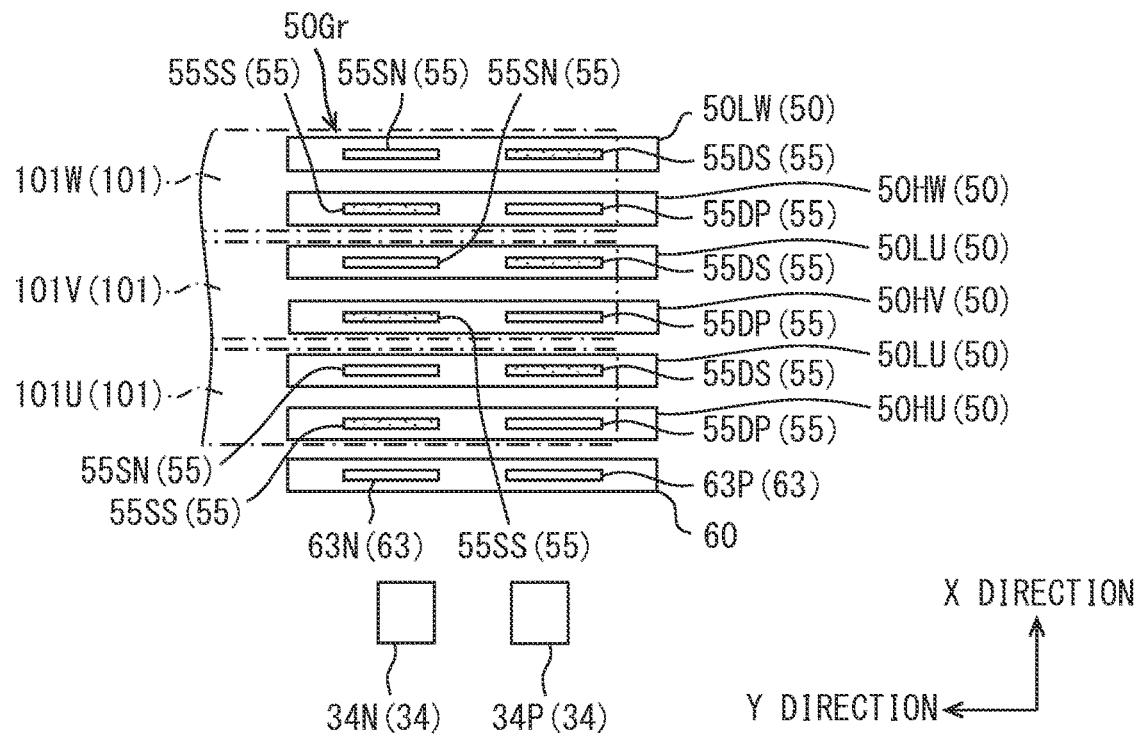
FIG. 7 is a diagram showing a connection between a semiconductor module and an output bus bar.

As shown in FIG. 7, the output bus bar 101 has a U-phase output bus bar 101U, a V-phase output bus bar 101V, and a W-phase output bus bar 101W. The output terminals 55DS and 55SS of the semiconductor module 50 constituting the U-phase upper and lower arm circuit 9 are connected to the output bus bar 101U. The output terminals 55DS and 55SS of the semiconductor module 50 constituting the V-phase upper and lower arm circuit 9 are connected to the output bus bar 101V. The output terminals 55DS and 55SS of the semiconductor module 50 constituting the W-phase upper and lower arm circuit 9 are connected to the output bus bar 101W.

The output bus bar 101 has a plurality of through holes 104 and a connection portion 105 provided around some of the through holes 104. The through hole 104 penetrates the output bus bar 101 in the plate thickness direction (Z direction). The connection portion 105 is provided around the through hole 104 in the output bus bar 101. Like the connection portion 103, the connection portion 105 is bent along the wall surface of the through hole 104 at an angle of approximately 90 degrees with respect to the output bus bar 101.

The output bus bar 101U has four through holes 104 into which the four main terminals 55 of the two semiconductor modules 50HU and 50LU are inserted, and two connection portions 105 to which the output terminals 55DS and 55SS are connected. Similarly, the output bus bar 101V has four through holes 104 through which the four main terminals 55 of the two semiconductor modules 50HV and 50LV are inserted respectively, and two connection portions 105 to which the output terminals 55DS and 55SS are connected. The output bus bar 101W has four through holes 104 through which the four main terminals 55 of the two semiconductor modules 50HW and 50LW are inserted respectively, and two connection portions 105 to which the output terminals 55DS and 55SS are connected.

The bus bar 100 (100P, 100N) and the output bus bar 101 may have a structure integrated by a holding member (not shown) as a bus bar module.

<Arrangement of Modules Constituting the Laminated Body>

Next, the arrangement of the semiconductor modules 50 and the dummy module 60 constituting the laminated body 40 will be described with reference to FIGS. 2 and 4.

The semiconductor modules 50HU, 50HV, 50HW, 50LU, 50LV, and 50LW included in the power conversion device 4 are arranged side by side in the X direction. These six semiconductor modules 50 are arranged in a row along the X direction. The two semiconductor modules 50 constituting the upper and lower arm circuit 9 in same phase are arranged next to each other in the X direction. As shown in FIG. 2, the semiconductor module 50HU, the semiconductor module 50LU, the semiconductor module 50HV, the semiconductor module 50LV, the semiconductor module 50HW, and the semiconductor module 50LW are arranged in this order from the side wall side of the case 20 in which the through holes 21 and 22 are formed. That is, the semiconductor module 50 that constitutes the U-phase upper and lower arm circuit 9, the semiconductor module 50 that constitutes the V-phase upper and lower arm circuit 9, and the semiconductor module 50 that constitutes the W-phase upper and lower arm circuit 9 are arranged in this order. The semiconductor module 50LW is arranged at a position farthest from the side wall of the case 20 in which the through holes 21 and 22 are formed.

As shown in FIG. 2, the dummy module 60 is arranged at a position closer to the side wall formed by the through holes 21 and 22 in the case 20 than all the semiconductor modules 50. In other words, the dummy module 60 is arranged closer to the introduction port of the refrigerant in the cooler 70 than all the semiconductor modules 50. The dummy module 60 is arranged in front of the semiconductor module 50HU. The dummy module 60 is sandwiched by the heat exchange portion 71 closest to the introduction port of the refrigerant, <Arrangement of Each Terminal>

Next, the arrangement of the terminal 34, the main terminal 55, and the dummy terminal 63N, that is, the connection positions with the corresponding bus bar 100 and the output bus bar 101 will be described with reference to FIGS. 2, 4, 7, and 9.

The terminal 34 of the capacitor module 30 projects from the vicinity of the side wall of the capacitor case 31 to the outside of the sealing resin body 33. As shown in FIG. 2, the terminal 34 is arranged in the vicinity of the side wall on the through hole 21 and 22 side in the capacitor case 31. The protruding portion of the positive electrode terminal 34P and the protruding portion of the negative electrode terminal 34N are arranged side by side in the Y direction, and are arranged line-symmetrically with respect to a center of the capacitor case 31 in the Y direction.

In a plan view from the Z direction, the terminal 34 is arranged at a position closer to the through holes 21 and 22, that is, the introduction port of the refrigerant in the cooler 70, than the laminated body 40. The terminal 34 is arranged between the support portion 23 and the side wall on which the through holes 21 and 22 are formed. At such a position, each of the terminals 34 is connected to the corresponding bus bar 100 as shown in FIG. 4.

Figure 8:
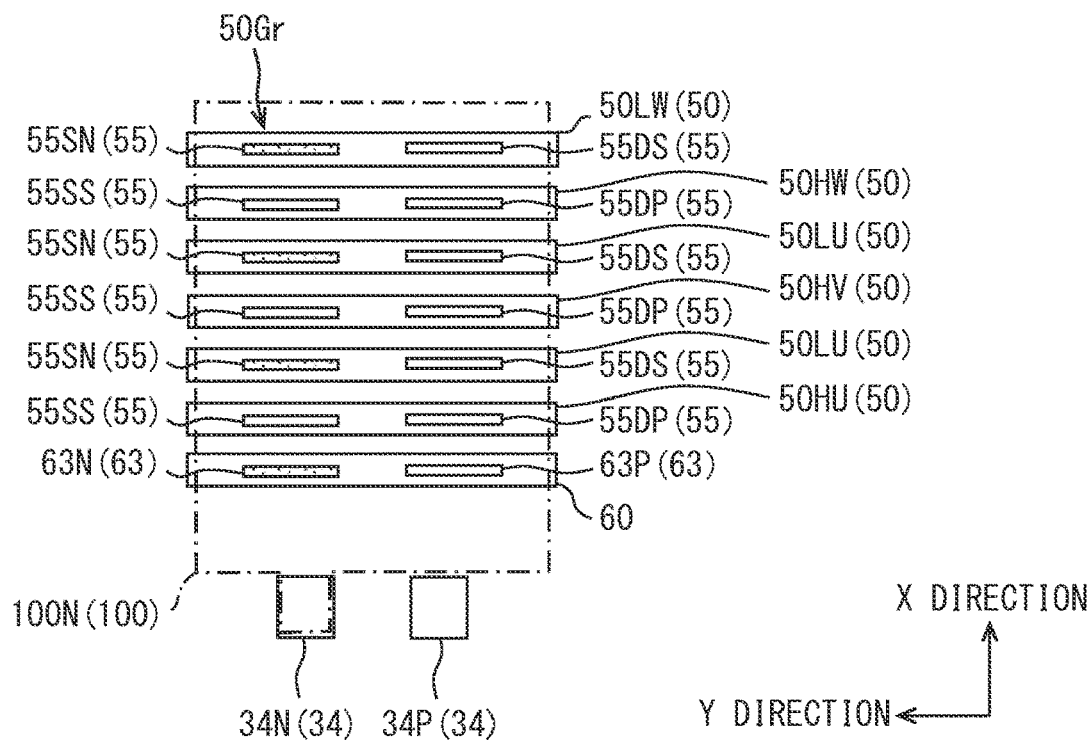
FIG. 8 is a diagram showing a connection between a semiconductor module and a dummy module and a negative electrode bus bar.
Figure 9:
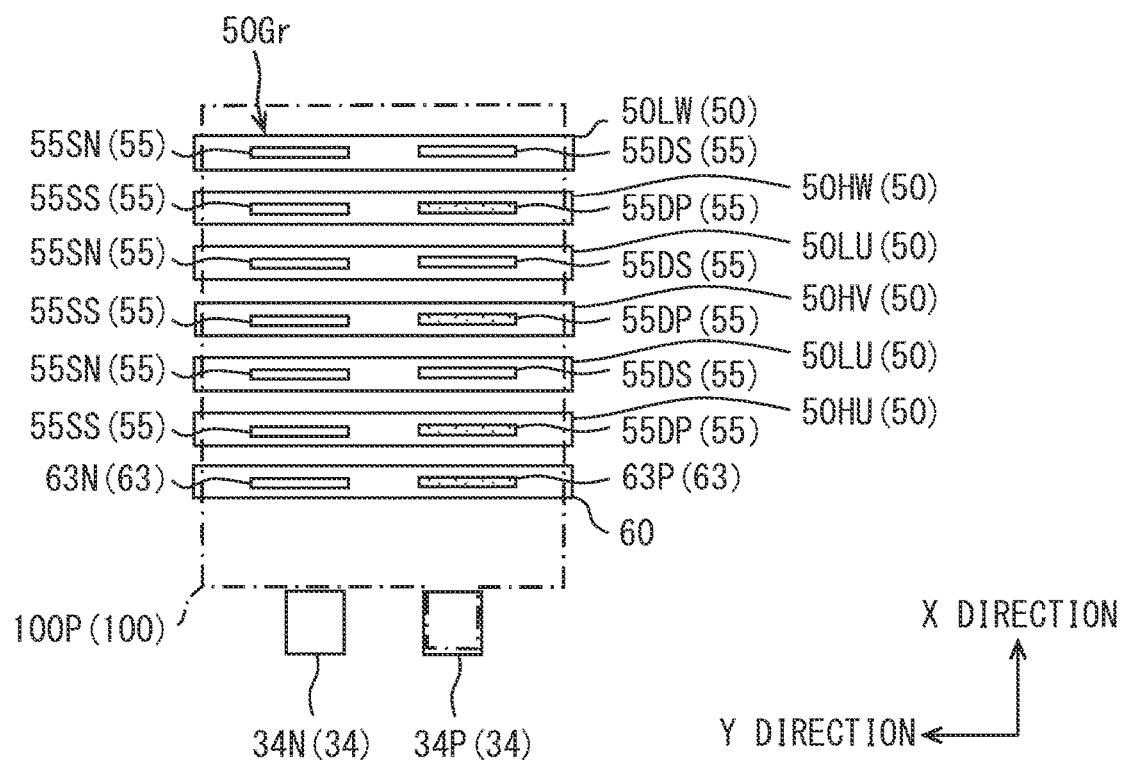
FIG. 9 is a diagram showing a connection between a semiconductor module and a dummy module and a positive electrode bus bar.

As shown in FIGS. 7 to 9, in the six semiconductor modules 50, the positive electrode terminals 55DP and the output terminals 55DS, which are drain terminals, are arranged in a row along the X direction. Similarly, the negative electrode terminal 55SN and the output terminal 55SS, which are source terminals, are also arranged in a row along the X direction. In this way, the plurality of main terminals 55 are arranged in two rows.

The dummy terminal 63P is arranged in a row together with the positive electrode terminal 55DP and the output terminal 55DS, which are drain terminals. As shown in FIGS. 4 and 7 to 9, from the side wall side where the through holes 21 and 22 are formed in the case 20, the dummy terminal 63P, the positive electrode terminal 55DP, the output terminal 55DS, the positive electrode terminal 55DP, the output terminal 55DS, and the positive electrode terminal 55DP and the output terminal 55DS are arranged in this order. Similarly, the dummy terminal 63N is arranged in a row together with the negative electrode terminal 55SN and the output terminal 55SS, which are source terminals. From the side wall side where the through holes 21 and 22 are formed in the case 20, the dummy terminal 63N, the output terminal 55SS, the negative electrode terminal 55SN, the output terminal 55SS, the negative electrode terminal 55SN, the output terminal 55SS, and the negative electrode terminal 55SN are arranged in this order.

FIGS. 7 to 9 show connection positions between the terminals of the modules constituting the laminated body 40 and the bus bars. In FIGS. 7 to 9, the through holes 102 and 104 and the connection portions 103 and 105 are omitted for convenience. In addition, hatching is added to clarify the terminals connected to the bus bar among the plurality of terminals.

FIG. 7 shows the connection positions between the output bus bar 101 and the main terminal 55. The output terminals 55DS and 55SS of the main terminals 55 are connected to the output bus bar 101. The main terminals 55 connected to the output bus bar 101 are arranged in a staggered manner. The dummy terminal 63 of the dummy module 60 is not connected to the output bus bar 101, The output bus bar 101 (101U, 101V, 101W) has two connection portions 105 corresponding to the output terminals 55DS and 55SS. The two connection portions 105 are provided around the two through holes 104 having a diagonal position relationship in the four through holes 104.

FIG. 8 shows the connection positions of the negative electrode bus bar 100N and the main terminal 55, and the connection positions of the negative electrode bus bar 100N and the dummy terminal 63. Of the main terminals 55, the negative electrode terminal 55SN, which is the source terminal, is connected to the negative electrode bus bar 100N. Of the dummy terminals 63, the dummy terminal 63N on the negative electrode side is connected to the negative electrode bus bar 100N. The seven terminals 55SN, 55SS, and 63N arranged in a row are connected to every other negative electrode bus bar 100N, As shown in FIG. 4, every other connection portion 103 is provided with respect to the seven through holes 102 arranged in the X direction.

The dummy terminal 63N is connected to the negative electrode bus bar 100N at a position closer to all the negative electrode terminals 55SN and by extension, all the main terminals 55 with respect to the connection position between the negative electrode terminal 34N and the negative electrode bus bar 100N of the capacitor module 30. The dummy terminal 63N is connected to the negative electrode bus bar 100N at a position closer to the connection portion of the negative electrode terminal 34N than the negative electrode terminal 553N.

FIG. 9 shows the connection positions of the positive electrode bus bar 100P and the main terminal 55, and the connection positions of the positive electrode bus bar 100P and the dummy terminal 63. Of the main terminals 55, the positive electrode terminal 55DP, which is a drain terminal, is connected to the positive electrode bus bar 100P. Of the dummy terminals 63, the dummy terminal 63P on the positive electrode side is connected to the positive electrode bus bar 100P. As described above, in the plurality of semiconductor modules 50 and dummy modules 60, the dummy module 60 is arranged next to the semiconductor module 50HU, The three connection portions 103 corresponding to the positive electrode terminals 55DP are provided every other with respect to the through holes 102. In the X direction, the connection portion 105 (through hole 104) corresponding to the dummy terminal 63P is provided next to the connection portion 103 (through hole 102) corresponding to the positive electrode terminal 55DP of the U phase.

The dummy terminal 63P is connected to the positive electrode bus bar 100P at a position closer to all the positive electrode terminals 55DP and, by extension, all the main terminals 55 with respect to the connection position between the positive electrode terminal 34P and the positive electrode bus bar 100P of the capacitor module 30. The dummy terminal 63P is connected to the positive electrode bus bar 100P at a position closer to the connection portion of the positive electrode terminal 34P than the positive electrode terminal 55DP.

Summary of First Embodiment

The power conversion device 4 of the present embodiment includes the dummy module 60. The metal body 61 of the dummy module 60 forms at least a part of the surface sandwiched by the heat exchange portion 71. Therefore, the metal body 61 is cooled by the heat exchange portion 71 having a flow path. The dummy terminal 63 of the dummy module 60 continues from the metal body 61 and is connected to the bus bar 100. Therefore, when the metal body 61 is cooled, the temperature of the bus bar 100 also drops via the dummy terminal 63. In this way, the capacitor module 30 can be cooled via the metal body 61, the dummy terminal 63, and the bus bar 100, and the temperature rise of the capacitor module 30 (capacitor element 32) can be suppressed. As a result, it is possible to provide the power conversion device 4 having a long life of the capacitor module 30.

Further, in the present embodiment, the dummy terminal 63 is connected to the bus bar 100 at a position closer to all the main terminals 55 connected to the bus bar 100 at the connection portions of the terminal 34 in the bus bar 100. The connection portion of the main terminal 55 is not provided between the connection portion of the dummy terminal 63 and the connection portion of the terminal 34 in the bus bar 100. Since the semiconductor module 50 provided with the semiconductor element 51 as a heating element is not provided in the heat transfer path between the dummy module 60 and the capacitor module 30, the cooling effect of the dummy module 60 tends to act on the capacitor module 30. As a result, the temperature rise of the capacitor module 30 can be effectively suppressed.

Further, in the present embodiment, the dummy module 60 is sandwiched by the heat exchange portion 71 closest to the introduction port of the refrigerant in the cooler 70, that is, the entrance of the introduction pipe 72. The closest heat exchange portion 71 is the closest heat exchange portion 71 in the flow path through which the refrigerant flows. The refrigerant before heat exchange with the semiconductor module 50 flows through the heat exchange portion 71 closest to the introduction port. The dummy module 60 is arranged on the upstream side of the flow path with respect to all the semiconductor modules 50. Therefore, the cooling effect of the dummy module 60 can be enhanced. As a result, the temperature rise of the capacitor module 30 can be effectively suppressed.

Further, in the present embodiment, the dummy module 60 includes two metal bodies 61P and 61N, and these metal bodies 61P and 61N are integrally held by the sealing resin body 62. The metal bodies 61P and 61N are exposed from the surface of the sealing resin body 62 sandwiched by the heat exchange portion 71, respectively, By adopting the resin sealing structure, it is easy to position the two metal bodies 61P and 61N with respect to the pair of heat exchange portions 71 in common. It becomes easy to form the laminated body 40.

Further, the dummy terminal 63P which continues from the metal body 61P is connected to the positive electrode bus bar 100P, and the dummy terminal 63N which continues from the metal body 61N is connected to the negative electrode bus bar 100N. Thereby, the capacitor module 30 can be cooled through both the positive electrode bus bar 100P and the negative electrode bus bar 100N. As a result, the entire capacitor element 32 can be cooled.

Further, in the present embodiment, as shown in FIG. 5, the metal body 61P is exposed from each of the one surface 62a and the back surface 62b of the sealing resin body 62. The metal body 61N is exposed from each of the one surface 62a and the back surface 62b of the sealing resin body 62. Each of the metal bodies 61P and 61N has exposed surfaces 61a on both sides in the X direction. Each of the metal bodies 61P and 61N can exchange heat with the heat exchange portion 71 on the one side 62a side and also with the heat exchange portion 71 on the back surface 62b side. Therefore, the cooling effect of the dummy module 60 can be enhanced, and the temperature rise of the capacitor module 30 can be effectively suppressed.

Further, in the present embodiment, the dummy modules 60 are arranged at the ends of the plurality of semiconductor modules 50 and dummy module 60 constituting the laminated body 40. As a result, as shown in FIG. 4, the circuit board 90 does not have to be arranged at a position overlapping the dummy module 60 in a plan view in the Z direction. The dummy module 60 does not have a signal terminal. The circuit board 90 is arranged at a position overlapping with the semiconductor module 50 provided with the signal terminal 56. Therefore, it is possible to suppress the vibration of the circuit board 90 due to the application of an external force.

Second Embodiment

A second embodiment is a modification of the preceding embodiment as a basic configuration and may incorporate description of the preceding embodiments. In the first embodiment, an example is shown in which the terminal 34 of the capacitor module 30 is closer to the introduction port of the refrigerant than the laminated body 40. Instead of this configuration, the terminal 34 may be arranged at a position away from the introduction port of the refrigerant.

Figure 10:
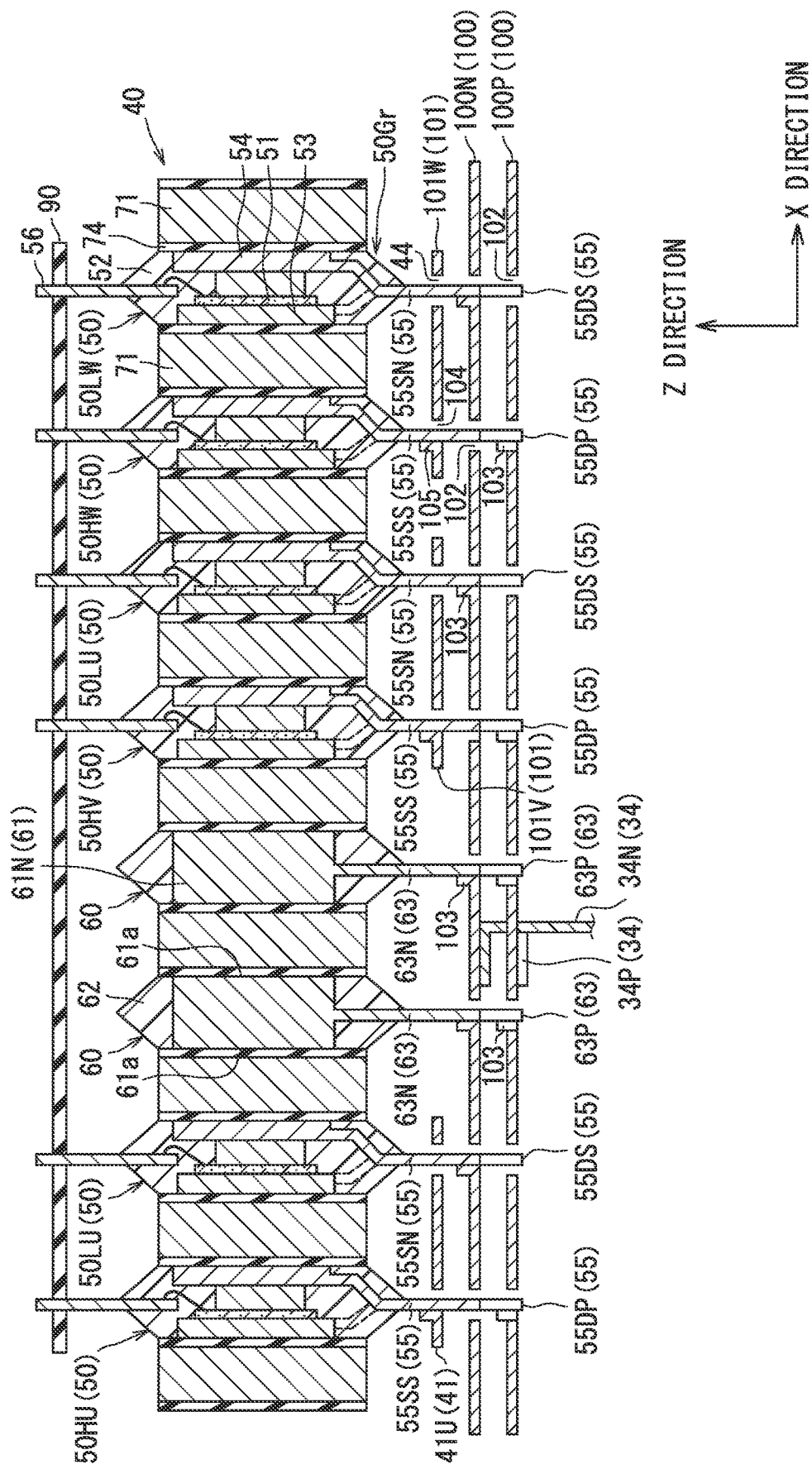
FIG. 10 is a cross-sectional view showing the structure of the power conversion device according to a second embodiment.

FIG. 10 shows the power conversion device 4 of the present embodiment and corresponds to FIG. 4. The terminals 34 (34P, 34N) of the capacitor module 30 are arranged at positions overlapping with the laminated body 40 in a plan view from the Z direction. Specifically, the terminal 34 is arranged at a position (an intermediate position) in the middle of the laminated body 40 in the laminating direction (X direction). The intermediate position is a position inside the ends of the plurality of semiconductor modules 50 and dummy modules 60.

As shown in FIG. 10, in the present embodiment as well, the dummy module 60 is arranged so that the connection portion of the dummy terminal 63 is closest to the connection portion of the terminal 34 in the bus bar 100. The laminated body 40 includes two dummy modules 60. The two dummy modules 60 are arranged between the semiconductor modules 50HU and 50LU constituting the U-phase upper and lower arm circuits 9 and the semiconductor modules 50HV and 50LV constituting the V-phase upper and lower arm circuits 9. In the X direction, the terminal 34 is connected to the bus bar 100 between the dummy terminals 63 of the two dummy modules 60.

As described above, the configuration is the same as that of the first embodiment except that the arrangement of the terminal 34 and the dummy module 60 is different.

Summary of Second Embodiment

In the present embodiment, the semiconductor module 50HU is sandwiched by the heat exchange portion 71 closest to the refrigerant introduction port. The configuration shown in the first embodiment is preferable in that the cold refrigerant can be utilized. Other than the above effect, the same effect as that of the first embodiment can be obtained.

For example, even if the terminal 34 is away from the introduction port of the refrigerant, the dummy terminal 63 is connected to the bus bar 100 at a position closer to all the main terminals 55 connected to the bus bar 100 at the connection portions of the terminal 34 in the bus bar 100. Since the cooling effect of the dummy module 60 tends to act on the capacitor module 30, the temperature rise of the capacitor module 30 can be effectively suppressed.

The arrangement of the terminal 34 and the dummy module 60 (dummy terminal 63) is not limited to the above example. The terminal 34 and the dummy module 60 may be arranged between the semiconductor modules 50HV and 50LV constituting the V-phase upper and lower arm circuit 9 and the semiconductor modules 50HW and 50LW constituting the W-phase upper and lower arm circuit 9. The dummy module 60 is preferably arranged between the phases.

The number of dummy modules 60 is not limited to two. It may be configured to include three or more dummy modules 60. As shown in the present embodiment, when the two dummy modules 60 (dummy terminals 63) are arranged so as to sandwich the connection portion of the terminal 34 in the X direction, it is possible to suppress the temperature rise of the capacitor module 30 and to suppress the increase in physique of the laminated body 40.

Third Embodiment

A third embodiment is a modification of the preceding embodiment as a basic configuration and may incorporate description of the preceding embodiments. In the first and second embodiments, the metal body 61 has both sides sandwiched by the heat exchange portion 71 in the dummy module 60. Instead of this configuration, the metal body 61 may have only one of the two sides sandwiched by the heat exchange portion 71.

Figure 11:
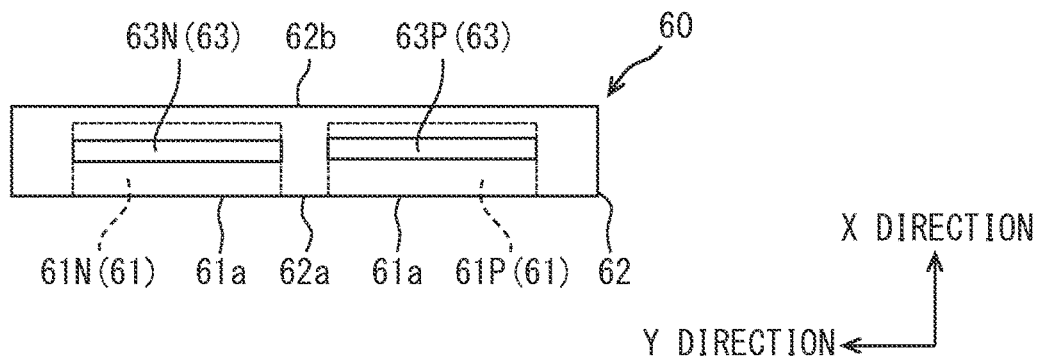
FIG. 11 is a plan view showing a dummy module in the power conversion device according to a third embodiment.

FIG. 11 shows a dummy module 60 in the power conversion device 4 of the present embodiment. FIG. 11 corresponds to FIG. 5, The dummy module 60 includes two metal bodies 61P and 61N as in the precedent embodiments. The metal bodies 61P and 61N are exposed from one surface 62a of the sealing resin body 62 and not from the back surface 62b. The metal bodies 61P and 61N have an exposed surface 61a exposed from one surface 62a. Other structures are similar to those in the precedent embodiments. The dummy module 60 of the present embodiment can be applied to the power conversion device 4 described in the precedent embodiments.

Summary of Third Embodiment

In the present embodiment, the dummy module 60 has a single-sided cooling structure. The metal body 61 (61P, 61N) is mainly cooled by the heat exchange portion 71 on the one side 62a side. As a result, the capacitor module 30 can be cooled via the metal body 61, the dummy terminal 63, and the bus bar 100, and the temperature rise of the capacitor module 30 (capacitor element 32) can be suppressed.

Although the example in which the metal body 61 is exposed only from one side surface 62a is shown, the metal body 61 may be exposed only from the back surface 62b.

Fourth Embodiment

A fourth embodiment is a modification of the preceding embodiment as a basic configuration and may incorporate description of the precedent embodiments. In the precedent embodiments, the two metal bodies 61P and 61N are exposed on the same surface. Instead of this configuration, the metal body 61P may be exposed to one surface of both sides sandwiched by the heat exchange portion 71, and the metal body 61N may be exposed to the other surface.

Figure 12:
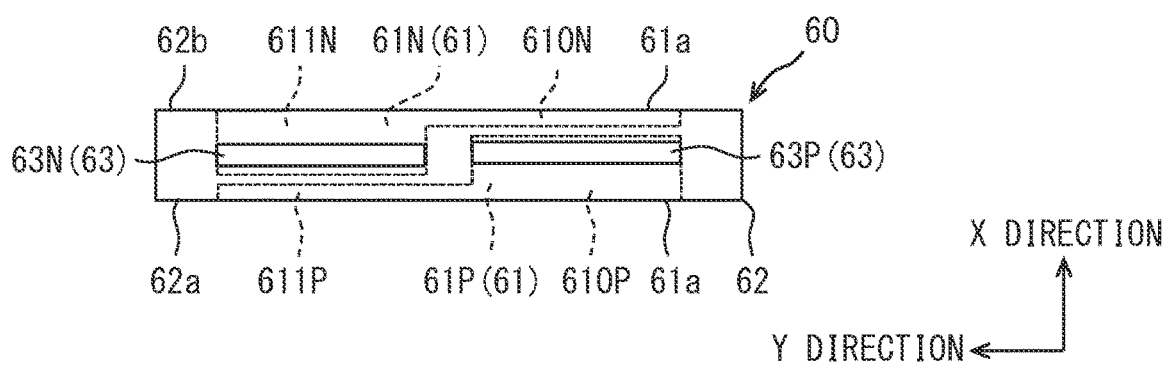
FIG. 12 is a plan view showing a dummy module in the power conversion device according to a fourth embodiment.
Figure 13:
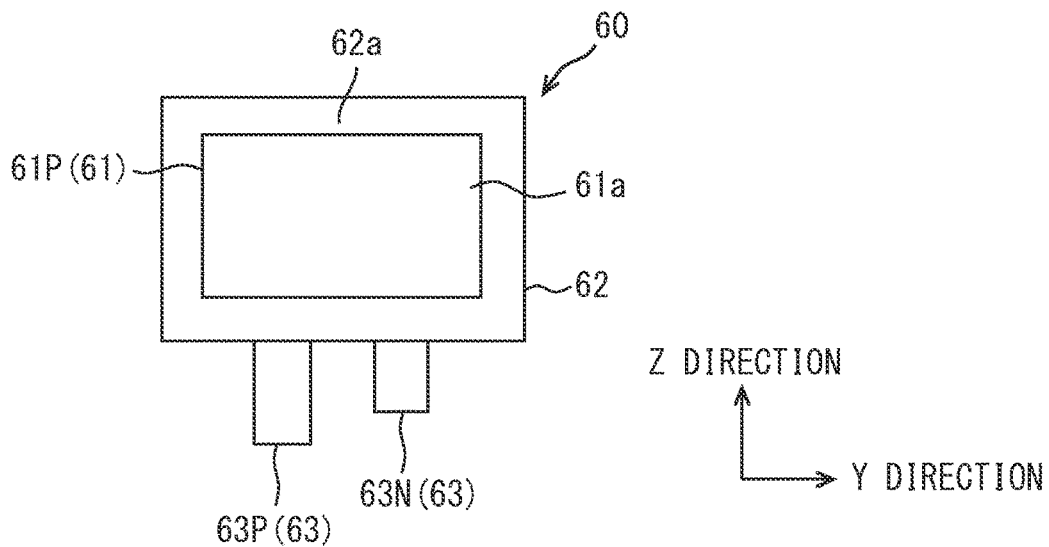
FIG. 13 is a plan view of a dummy module seen from the X1 direction.

FIGS. 12 and 13 show a dummy module 60 in the power conversion device 4 of the present embodiment. FIG. 12 corresponds to FIG. 5, and FIG. 13 corresponds to FIG. 6. The dummy module 60 includes two metal bodies 61P and 61N as in the precedent embodiments. The metal body 61P is exposed only from one surface 62a of the sealing resin body 62. The metal body 61N is exposed only from the back surface 62b of the sealing resin body 62.

The metal body 61P includes a thick portion 610P and a thin portion 611P which continue to the thick portion 610P and has a thickness in the X direction thinner than that of the thick portion 610P. The dummy terminal 63P continues to the thick portion 610P. The thick portion 610P and the thin portion 611P are provided side by side in the Y direction. The outer surface of the thick portion 610P and the outer surface of the thin portion 611P are connected to each other with substantially one surface so as to form the exposed surface 61a on the one surface 62a side.

Similarly, the metal body 61N includes a thick portion 610N and a thin portion 611N which is connected to the thick portion 610N and has a thickness in the X direction thinner than that of the thick portion 610N. The dummy terminal 63N continues to the thick portion 610N. The thick portion 610N and the thin portion 611N are provided side by side in the Y direction. The outer surface of the thick portion 610N and the outer surface of the thin portion 611N are substantially flush with each other to form an exposed surface 61a on the back surface 62b side.

In a plan view from the Z direction, the metal bodies 61P and 61N are substantially L-shaped. The metal bodies 61P and 61N are, for example, irregularly shaped metal plates. The metal bodies 61P and 61N have the same structure as each other, and are arranged symmetrically twice around the Z axis. In the laminating direction (X direction) of the laminated body 40, the thick portion 610P of the metal body 61P and the thin portion 611N of the metal body 61N face each other. Further, the thin portion 611P of the metal body 61P and the thick portion 610N of the metal body 61N face each other.

A gap is provided between the metal bodies 61P and 61N to ensure electrical insulation. In the present embodiment, the sealing resin body 62 is arranged in the gap. Instead of the sealing resin body 62, for example, a resin spacer may be fixed in advance between the metal bodies 61P and 61N, and this structure may be resin-sealed. Other structures are similar to those in the precedent embodiments. The dummy module 60 of the present embodiment can be applied to the power conversion device 4 described in the precedent embodiments.

Summary of Fourth Embodiment

In the present embodiment, the metal body 61P is exposed on one surface 62a and the metal body 61N is exposed on the back surface 62b, so that the dummy module 60 has a double-sided cooling structure. The metal bodies 61P and 61N are exposed on different surfaces from each other. The metal body 61P can mainly exchange heat with the heat exchange portion 71 on the one surface 62a side, and the metal body 61N can mainly exchange heat with the heat exchange portion 71 on the back surface 62b side. Therefore, the cooling effect of the dummy module 60 can be enhanced, and the temperature rise of the capacitor module 30 can be effectively suppressed.

Further, in the present embodiment, the metal bodies 61P and 61N have the thick portions 610P and 610N and the thin portions 611P and 611N. The metal bodies 61P and 61N are arranged so that one thick portion faces the other thin portion. As a result, the thick portion 610P and the thin portion 611P of the metal body 61P form an exposed surface 61a on the one surface 62a side. Similarly, the thick portion 610N and the thin portion 611N of the metal body 61N form an exposed surface 61a on the back surface 62b side. Therefore, although one metal body 61 is configured to be exposed only on one surface of the sealing resin body 62, the exposed surface 61a can be increased without changing the physique (size) of the dummy module 60. Thereby, the cooling effect of the dummy module 60 can be further enhanced.

An example is shown in which the metal body 61 is exposed from one surface 62a and the metal body 61N is exposed from the back surface 62b, but the present disclosure is not limited to this configuration. The metal body 61 may be exposed from the back surface 62b, and the metal body 61N may be exposed from the one surface 62a.

An example is shown in which the metal bodies 61P and 61N have the thick portions 610P and 610N and the thin portions 611P and 611N, but the present disclosure is not limited to the above configuration. The metal bodies 61P and 61N may have only portions corresponding to the thick portions 610P and 610N. In this case, although the exposed surface 61a cannot be increased, the heat exchange portion 71 on the one surface 62a side and the heat exchange portion 71 on the back surface 62b side can be utilized.

Other Embodiments

The disclosure in this specification and drawings etc. is not limited to the above-described embodiments. The disclosure encompasses the above-described embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiments. The disclosure covers omissions of parts and/or elements of the embodiments. The disclosure covers replacement or combination of components, elements between one of the embodiments and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

The control circuit 13 and the drive circuit 14 are provided by a control system including at least one computer. The computer includes at least one processor (hardware processor) that is hardware. The hardware processor may be provided by the following (i), (ii), or (iii).

(i) The hardware processor may be a hardware logic circuit. In this case, the computer is provided by a digital circuit including a number of programmed logic units (gate circuits). The digital circuit may comprise a memory for storing programs and/or data. The computer may be provided by an analog circuit. The computer may be provided by a combination of a digital circuit and an analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium, which non-temporarily stores a program and/or data readable by the processor.

(iii) The hardware processor may be a combination of the above (i) and the above (ii). (i) and (ii) are placed on different chips or on a common chip.

That is, the means and/or functions provided by the control circuit 13 and the drive circuit 14 can be provided by hardware only, software only, or a combination thereof.

The switching element constituting the power conversion circuit (inverter 6) is not limited to the MOSFET 11. For example, an IGBT may be used.

An example is shown in which all the semiconductor modules 50 are arranged in a row. In other words, an example is shown in which one semiconductor module 50 is arranged between a pair of heat exchange portions 71. The present disclosure is not limited to this example. For example, two semiconductor modules 50 constituting the same phase may be arranged between the pair of heat exchange portions 71, and the semiconductor modules 50 included in the power conversion device 4 may be arranged in two rows. In this case, it is preferable that the dummy modules 60 are also arranged in two rows according to the arrangement of the semiconductor modules 50.

Although an example in which one arm is configured by one semiconductor module 50 is shown, the present disclosure is not limited to this configuration. In the modified example shown in FIG. 14, the semiconductor module 50 includes a semiconductor element 51 that constitutes a one-phase upper and lower arm circuit 9. The illustrated semiconductor module 50 is a semiconductor module 50U that constitutes a U-phase upper and lower arm circuit 9, and is a combination of the two semiconductor modules 50HU and 50LU described in the precedent embodiments. The semiconductor module 50 includes a positive electrode terminal 55P, a negative electrode terminal 55N, and an output terminal 55S as the main terminal 55. The three main terminals 55 are arranged side by side in the Y direction.

The dummy module 60 includes a metal body 61S in addition to the metal body 61P and the metal body 61N described above. A dummy terminal 63S is connected to the metal body 61S. The positive electrode terminal 55P and the dummy terminal 63P of each phase are arranged side by side in the X direction, and these terminals 55P and 63P are connected to the positive electrode bus bar 100P. The negative electrode terminal 55N and the dummy terminal 63N of each phase are arranged side by side in the X direction, and these terminals 55N and 63N are connected to the negative electrode bus bar 100N. The output terminal 55S and the dummy terminal 63S of each phase are arranged side by side in the X direction. The dummy terminal 63S is connected to one of the output bus bars 101. By arranging the dummy terminal 63 corresponding the main terminal 55, the connection with the bus bar 100 and the output bus bar 101 becomes easy.

In FIG. 14, an example in which the dummy module 60 has three metal bodies 61 (61P, 61N, 61S) corresponding to the main terminal 55, but the present disclosure is not limited thereto. Only the metal bodies 61P and 61N may be provided.

Although an example in which the capacitor module 30 is arranged directly under the laminated body 40 is shown, the present disclosure is not limited to this configuration. For example, the capacitor module 30 may be arranged at a position displaced in the Y direction with respect to the laminated body 40.

The arrangement of the bus bar 100 is not limited to the above example. For example, the positive electrode bus bar 100P is arranged on the capacitor module 30 side and the negative electrode bus bar 100N is arranged on the laminated body 40 side, but the arrangement may be reversed.

In the bus bar 100 and the output bus bar 101, an example in which one through hole 102, 104 is provided for one terminal is shown, but the present disclosure is not limited thereto. At least a part of the through holes may be provided so that a plurality of terminals can be inserted.

The dummy module 60 has at least one metal body 61 and at least one dummy terminal 63 that continues from the metal body 61 and connects to the bus bar 100, and the metal body 61 may be configured to form at least a part of the surface sandwiched by the heat exchange portion 71 in the dummy module 60. For example, the dummy module 60 may include only one metal body 61 and one dummy terminal 63. The dummy terminal 63 is connected to one of the bus bars 100. Therefore, the temperature rise of the capacitor module 30 (capacitor element 32) can be suppressed via the metal body 61, the dummy terminal 63, and the bus bar 100.

What is claimed is:

1. A power conversion device, comprising:
a semiconductor module group including a plurality of semiconductor modules, each of the semiconductor modules having at least one semiconductor element constituting a power conversion circuit and at least two main terminals electrically connected to the semiconductor element,
at least one dummy module that does not have a semiconductor element and is arranged side by side with at least some of the semiconductor modules,
a cooler including a plurality of heat exchange portions having a flow path through which a refrigerant flows respectively and being arranged so as to sandwich each of the semiconductor modules and the dummy module from both sides in an arrangement direction of the semiconductor modules and the dummy module, a capacitor, and at least one bus bar that electrically connects the capacitor and the main terminals, wherein the dummy module has a metal body, and a dummy terminal which continues from the metal body and is connected to the bus bar, the metal body forms at least a part of a surface of the dummy module sandwiched by the heat exchange portions, and the dummy terminal is connected to the bus bar at a position closer to the main terminals connected to the bus bar with respect to a connection portion of the capacitor in the bus bar.

2. The power conversion device according to claim 1, wherein the dummy module is sandwiched by the heat exchange portions closest to an introduction port of the refrigerant in the cooler.

3. The power conversion device according to claim 1, wherein the dummy module has a sealing resin body that seals the metal body, the dummy terminal protrudes outside the sealing resin body and is connected to the bus bar, and the metal body is exposed from at least one of both sides sandwiched by the heat exchange portions in the sealing resin body.

4. The power conversion device according to claim 3, wherein each semiconductor module of the semiconductor module group has a positive electrode terminal and a negative electrode terminal as the main terminals, the capacitor has a positive electrode and a negative electrode, the bus bar has a positive electrode bus bar connected to the positive electrode of the capacitor and the positive electrode terminal, and a negative electrode bus bar connected to the negative electrode of the capacitor and the negative electrode terminal, the dummy module has a first metal body and a second metal body electrically separated from the first metal body as the metal body, and the dummy terminal comprises:

a first dummy terminal which continues from the first metal body, protrudes outside the sealing resin body and connects to the positive electrode bus bar, and a second dummy terminal which continues from the second metal body, protrudes outside the sealing resin body and connects to the negative electrode bus bar, and each of the first metal body and the second metal body is exposed from at least one of both sides sandwiched by the heat exchange portions in the sealing resin body.

5. The power conversion device according to claim 4, wherein the sealing resin body has a first surface, which is one of both sides, and a second surface, which is the other one of both sides and is opposite to the first surface, and both the first metal body and the second metal body are exposed on each of the first surface and the second surface.

6. The power conversion device according to claim 4, wherein the sealing resin body has a first surface, which is one of both sides, and a second surface, which is the other one of both sides and is opposite to the first surface, and only the first metal body is exposed on the first surface, and only the second metal body is exposed on the second surface.

7. The power conversion device according to claim 6, wherein each of the first metal body and the second metal body has a thick portion and a thin portion which continues from the thick portion, and is thinner in the arrangement direction than the thick portion, in the arrangement direction, the first metal body and the second metal body are arranged in such a manner that the thick portion of the first metal body faces the thin portion of the second metal body, and the thin portion of the first metal body faces the thick portion of the second metal body, and the thick portion and the thin portion of the first metal body are exposed from the first surface, and the thick portion and the thin portion of the second metal body are exposed from the second surface.

8. The power conversion device according to claim 4, wherein the sealing resin body has a first surface, which is one of both sides, and a second surface, which is the other one of both sides and is opposite to the first surface, and the first metal body and the second metal body are exposed only from the first surface of the first surface and the second surface.

* * * * *